United States Patent
Keser et al.

(10) Patent No.: US 9,601,472 B2
(45) Date of Patent: Mar. 21, 2017

(54) PACKAGE ON PACKAGE (POP) DEVICE COMPRISING SOLDER CONNECTIONS BETWEEN INTEGRATED CIRCUIT DEVICE PACKAGES

(71) Applicant: QUALCOMM Incorporated, San Diego, CA (US)

(72) Inventors: Lizabeth Ann Keser, San Diego, CA (US); David Fraser Rae, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/837,917

(22) Filed: Aug. 27, 2015

(65) Prior Publication Data

US 2016/0315072 A1 Oct. 27, 2016

Related U.S. Application Data

(60) Provisional application No. 62/152,663, filed on Apr. 24, 2015.

(51) Int. Cl.
*H01L 25/10* (2006.01)
*H01L 23/498* (2006.01)
(Continued)

(52) U.S. Cl.
CPC .......... *H01L 25/105* (2013.01); *H01L 23/498* (2013.01); *H01L 24/19* (2013.01); *H01L 24/20* (2013.01); *H01L 25/50* (2013.01); *H01L 21/568* (2013.01); *H01L 2224/04105* (2013.01); *H01L 2224/12105* (2013.01); *H01L 2224/16227* (2013.01); *H01L 2224/32145* (2013.01); *H01L 2224/32225* (2013.01);
(Continued)

(58) Field of Classification Search
CPC ............. H01L 25/105; H01L 23/49575; H01L 2224/37147
USPC .......................................... 257/686; 438/197
See application file for complete search history.

(56) References Cited

U.S. PATENT DOCUMENTS

| | | | |
|---|---|---|---|
| 8,288,203 B2 | 10/2012 | Cho et al. | |
| 8,937,392 B2 | 1/2015 | Hirose et al. | |
| 2007/0048886 A1* | 3/2007 | Winters | H01L 51/56 438/29 |
| 2007/0052070 A1* | 3/2007 | Islam | H01L 21/561 257/666 |
| 2009/0321908 A1* | 12/2009 | Song | H01L 25/03 257/686 |
| 2010/0117242 A1 | 5/2010 | Miller et al. | |
| 2011/0024916 A1* | 2/2011 | Marimuthu | H01L 21/565 257/774 |
| 2012/0061835 A1* | 3/2012 | Hosseini | H01L 24/03 257/739 |
| 2013/0000960 A1 | 1/2013 | Lee et al. | |
| 2013/0001797 A1 | 1/2013 | Choi et al. | |
| 2013/0056776 A1* | 3/2013 | Su | H01L 33/60 257/98 |

(Continued)

OTHER PUBLICATIONS

International Search Report and Written Opinion—PCT/US2016/029055—ISA/EPO—Aug. 5, 2016.

*Primary Examiner* — Moazzam Hossain
*Assistant Examiner* — Omar Mojaddedi
(74) *Attorney, Agent, or Firm* — Loza & Loza LLP

(57) ABSTRACT

Some features pertain to a package on package (PoP) device that includes a first package, a first solder interconnect coupled to the first integrated circuit package, and a second package coupled to the first package through the first solder interconnect. The second package includes a first die, a package interconnect comprising a first pad, where the first solder interconnect is coupled to the first pad of the package interconnect. The second package also includes a redistribution portion coupled to the first die and the package interconnect, an encapsulation layer at least partially encapsulating the first die and the package interconnect. The first pad may include a surface that has low roughness. The encapsulation layer may encapsulate the package interconnect such that the encapsulation layer encapsulates at least a portion of the first solder interconnect.

20 Claims, 18 Drawing Sheets

(51) Int. Cl.
*H01L 23/00* (2006.01)
*H01L 25/00* (2006.01)
*H01L 21/56* (2006.01)

(52) U.S. Cl.
CPC ......... *H01L 2224/48091* (2013.01); *H01L 2224/48227* (2013.01); *H01L 2224/48235* (2013.01); *H01L 2224/73265* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/14* (2013.01); *H01L 2924/1431* (2013.01); *H01L 2924/1434* (2013.01); *H01L 2924/15311* (2013.01)

(56) References Cited

U.S. PATENT DOCUMENTS

| | | |
|---|---|---|
| 2013/0228918 A1 | 9/2013 | Chen et al. |
| 2013/0299989 A1* | 11/2013 | Arvin ............ H01L 24/03 257/751 |
| 2014/0080266 A1* | 3/2014 | Lee ............... H01L 21/52 438/125 |
| 2014/0167262 A1 | 6/2014 | Yap |
| 2014/0264946 A1 | 9/2014 | Kim et al. |

* cited by examiner

PACKAGE ON PACKAGE (POP) DEVICE COMPRISING SOLDER CONNECTIONS BETWEEN INTEGRATED CIRCUIT DEVICE PACKAGES

CLAIM OF PRIORITY/CLAIM OF BENEFIT

The present application claims priority to U.S. Provisional Application No. 62/152,663 titled "Package on Package (POP) Device Comprising Improved Solder Connection Between Integrated Circuit Device Packages", filed Apr. 24, 2015, which is hereby expressly incorporated by reference herein.

BACKGROUND

Field

Various features relate generally to a package on package (PoP) device, and more specifically to a package on package (PoP) device that includes solder connections between integrated circuit (IC) packages.

Background

FIG. 1 illustrates a device 100 that includes a first package 102 and an interposer 104. The first package 102 includes a first die 120 and a first package substrate 122. The first package substrate 122 includes a plurality of pads 124 and a first pad 126. The first package substrate 122 also includes a first dielectric layer 123. The first package substrate 122 may also include a first solder resist layer 127. The first solder resist layer 127 is located on the first dielectric layer 123. The first solder resist layer 127 may also cover a portion of the first pad 126. The first die 120 is coupled to the first package substrate 122 through a first plurality of solder balls 128. Specifically, the first die 120 is coupled to the first plurality of pads 124 through the first plurality of solder balls 128. A second plurality of solder balls 130 is coupled to the first package substrate 122.

The interposer 104 includes a second pad 146. The interposer 104 may be a package substrate of a second package (not shown). The interposer 104 also includes a second dielectric layer 143. The interposer 104 may also include a second solder resist layer 147. The second solder resist layer 147 is located on the second dielectric layer 143. The second solder resist layer 147 may also cover a portion of the second pad 146. The interposer 104 is coupled to the first package 102 through a first solder ball 156. For example, the first solder ball 156 is coupled to the first pad 126 of the first package substrate 122, and the second pad 146 of the interposer 104. The solder ball 156 is located in a cavity of an encapsulation layer 150 of the first package 102. The cavity of the encapsulation layer 150 in which the solder ball 156 is located in is formed by using a laser process (e.g., laser ablation).

As shown in FIG. 1, the first pad 126 has a surface that is in contact with the solder ball 156. The surface of the first pad 126 that is in contact with the solder ball 156 has a relatively rough surface roughness. This is due to the fact that a laser is used to remove the encapsulation layer 150 over the first pad 126. The result of this laser process (e.g., laser ablation) is an uneven surface (e.g., rough surface) on the first pad 126. An uneven surface or rough surface on the first pad 126 can result in a weak joint, a poor joint and/or an open joint between the first pad 126 and the solder ball 156. A weak joint or poor joint connection can result in poor and/or unreliable signal quality in the device 100, which can cause poor performance in the device 100.

Therefore, there is a need for a device (e.g., package on package (PoP) device) with strong and reliable joints to ensure better quality and/or performance signals between packages. Ideally, such a device will have a better form factor, be cheaper to fabricate, while at the same time meeting the needs and/or requirements of mobile and/or wearable devices.

SUMMARY

Various features relate generally to a package on package (PoP) device, and more specifically to a package on package (PoP) device that includes solder connections between integrated circuit (IC) packages.

One example provides a package on package (PoP) device that includes a first package, a first solder interconnect coupled to the first package, and a second package coupled to the first package through the first solder interconnect. The second package includes a first die, a package interconnect comprising a first pad, where the first solder interconnect is coupled to the first pad of the package interconnect, and a redistribution portion coupled to the first die and the package interconnect, and an encapsulation layer encapsulating the first die and the package interconnect.

Another example provides a package on package (PoP) device that includes a first package, a first solder interconnect coupled to the first package, and a second package coupled to the first package through the first solder interconnect. The second package includes a first die, means for interconnecting package portions coupled to the first solder interconnect, a redistribution portion coupled to the first die and the means for interconnecting package portions, and an encapsulation layer encapsulating the first die and the means for interconnecting package portions.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to a package on package (PoP) device that includes a first package, a first solder interconnect coupled to the first package, and a second package coupled to the first package through the first solder interconnect. The second package includes a first die, a package interconnect comprising a first pad, where the first solder interconnect is coupled to the first pad of the package interconnect. The second package also includes a redistribution portion coupled to the first die and the package interconnect, an encapsulation layer encapsulating the first die and the package interconnect. The first pad may include a surface that has low roughness. The encapsulation layer may encapsulate the package interconnect such that the encapsulation layer encapsulates at least a portion of the first solder interconnect. In some implementations, the encapsulation layer encapsulates the package interconnect such that the encapsulation layer encapsulates at least a portion of the first solder interconnect. In some implementations, the encapsulation layer encapsulates the package interconnect such that there is a cavity between the encapsulation layer and a portion of the first pad when the first solder interconnect is coupled to the first pad and the first package.

In some implementation, an interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Exemplary Package on Package (PoP) Device Comprising Solder Connections

Figure 1:
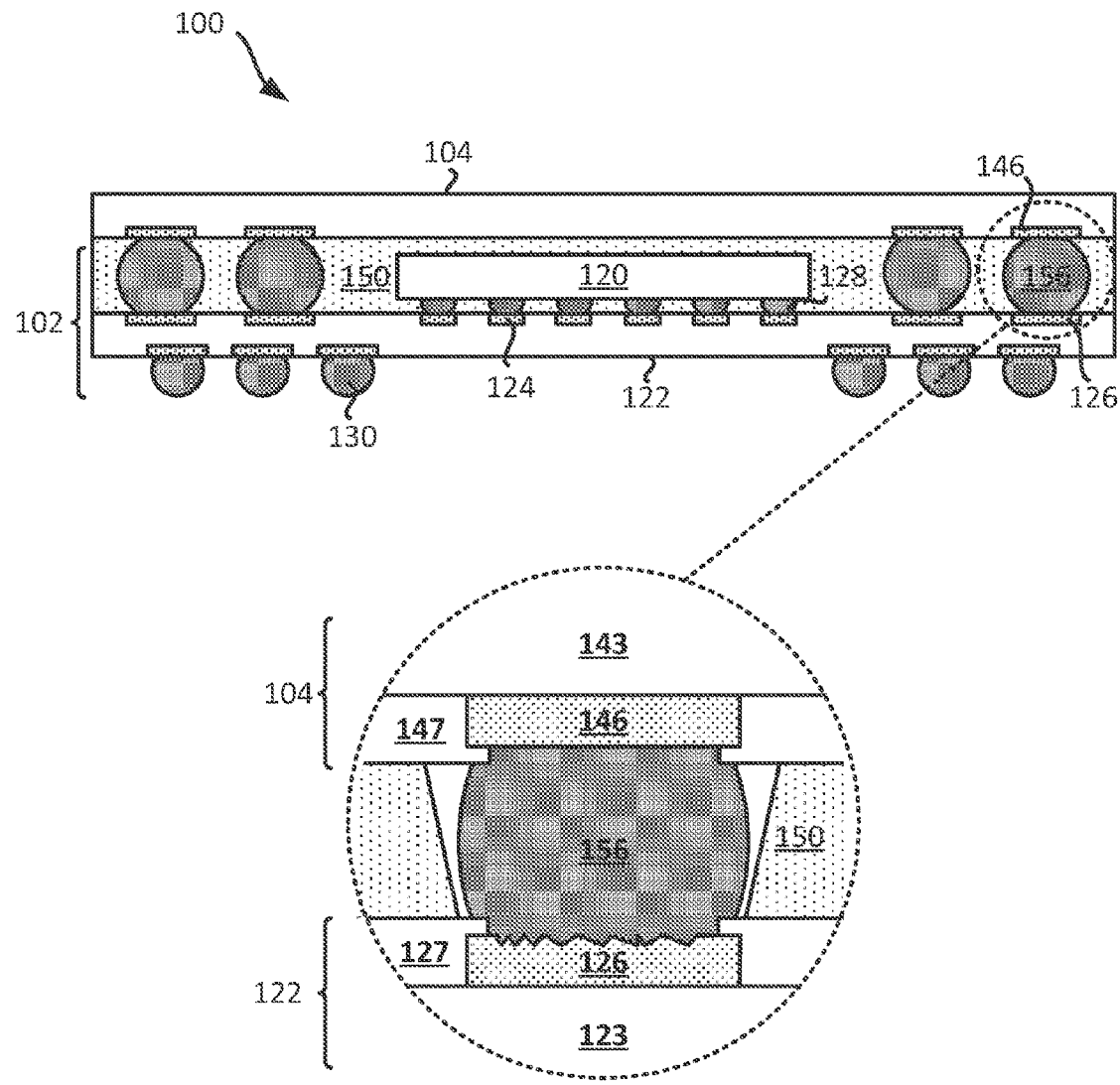
FIG. 1 illustrates a device that includes a first package and an interposer.
Figure 2:
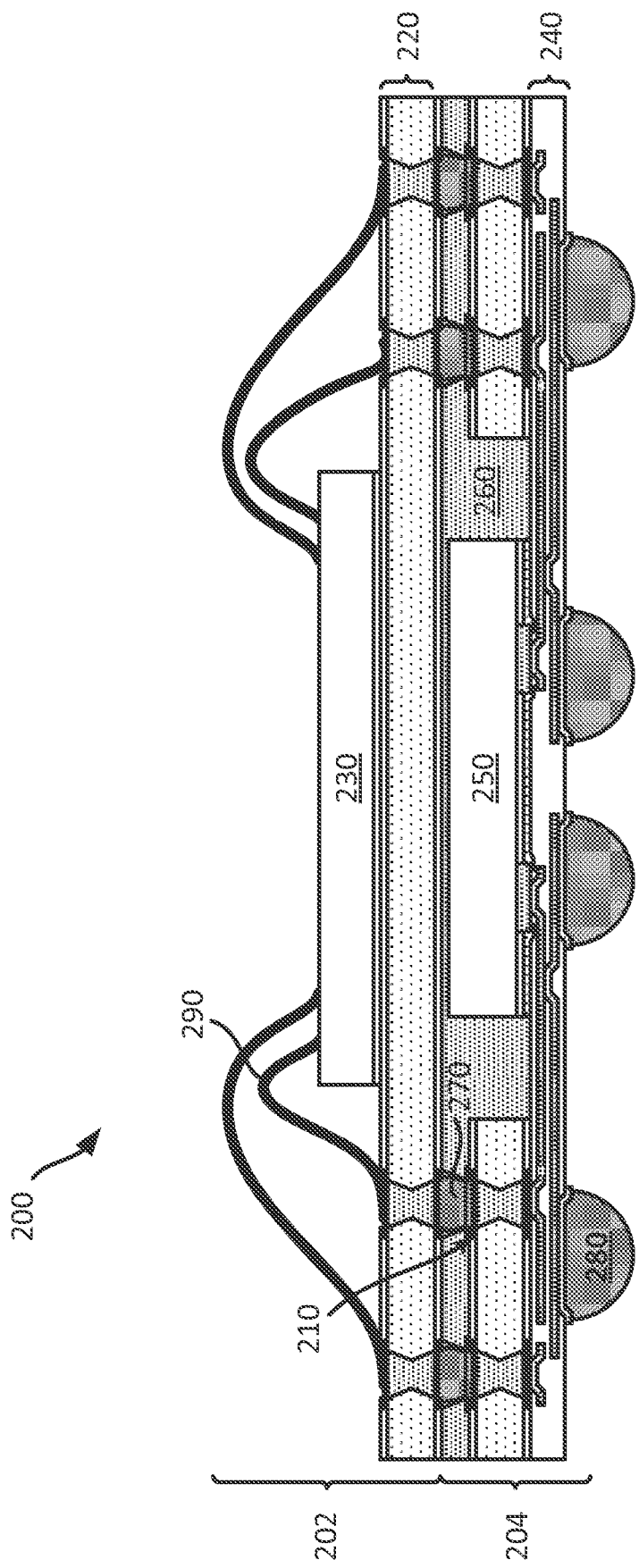
FIG. 2 illustrates an example of a package on package (PoP) device with solder connections.

FIG. 2 illustrates a package on package (PoP) device that includes solder connections. The package on package (PoP) device 200 includes a first package 202 (e.g., first integrated circuit device package) and a second package 204 (e.g., second integrated circuit device package). The first package 202 is coupled to the second package 204 through at least one solder interconnect 270 (e.g., at least one solder ball).

The first package 202 (e.g., first integrated circuit device package) includes a first package substrate 220, a first die 230, and at least one wire bond 290. A die (e.g., first die 230) may be an integrated circuit (IC) that includes several transistors and/or other electronic components. The first die 230 may be a logic die and/or a memory die. The first die 230 is coupled to the first package substrate 220. The at least one wire bond 290 is coupled to the first die 230 and the first package substrate 220. The first package substrate 220 may include at least one dielectric layer, at least one solder resist layer, at least one via in the dielectric layer, and at least one pad. The first package 202 and the first package substrate 220 are described in further detail below in FIG. 3.

The second package 204 (e.g., second integrated circuit device package) includes a package interconnect 210, a redistribution portion 240, a second die 250, an encapsulation layer 260, and a solder ball 280. The second package 204 may be a fan out wafer level package (FOWLP). The second die 250 may be a logic die and/or a memory die. The second die 250 is coupled to the redistribution portion 240. The package interconnect 210 is coupled to the redistribution portion 240. The redistribution portion 240 may be a fan out portion (e.g. for fanning or routing of signaling to and from devices with different I/O pitches). The encapsulation layer 260 at least partially encapsulates the second die 250 and the package interconnect 210. The term "encapsulates" may mean to at least surround an object or component. When a material A encapsulates a material B, the material A may at least partially surround the material B. When the material A encapsulates the material B, the material A may be physically touching some or all portions of the material B. In some implementations, the material A may encapsulate material B without directly touching any part of the material B.

Different implementations may use a package interconnect (e.g., package interconnect 210) with different designs and configurations. In some implementations, the package interconnect may be a means for interconnecting package portions. In some implementations, the package interconnect or means for interconnecting package portions may be a package interconnect from a group of package interconnects comprising a printed circuit board (PCB) bar, a preformed through substrate via (TSV) bar, and/or an in-situ plated metal interconnect (e.g., in-situ plated copper interconnect). In some implementations, the redistribution portion 240 may include at least one dielectric layer, and/or at least one redistribution layer. In some implementations, the redistribution portion 240 may also include at least one under bump metallization (UBM) layer. In some implementations, the selection of a particular package interconnect may depend on cost, design rule requirements, and overall height. For example, a plated metal interconnect or TSV bar may have finer design rules and a lower profile, but would be more expensive than a larger and thicker PCB bar. The package interconnect 210 will be further described below in FIG. 3.

As mentioned above, the first package 202 is coupled to the second package 204 through at least one solder interconnect 270 (e.g., at least one solder ball). As shown in FIG. 2, the first package 202 is coupled to the package interconnect 210 of the second package 204 through the at least one solder interconnect 270. As will be further described below in at least FIG. 3, the package interconnect 210 includes a pad (e.g., first pad 330) that is coupled to the solder interconnect 270. The pad (e.g., first pad 330) that is coupled to the solder interconnect 270, has a smooth surface (e.g., not rough relative to pad that has been exposed to laser).

The roughness of a surface can be expressed by the vertical deviations of the roughness profile of the surface from the mean line. For example, the roughness of a surface can be expressed by the amplitude parameters and/or variations of the surface from a mean flat surface and/or a mean line of the surface. In some implementations, the arithmetic average ($R_a$) of the absolute values of the amplitude of the vertical deviation of the roughness profile of the surface (e.g., pad surface) from a mean line is one example of quantifying roughness. In some implementations, the roughness of the surface of the pad that is coupled to the solder interconnect 270 has a $R_a$ value (surface roughness $R_a$ value) of about 1 micron (μm) or less. In some implementations, a low $R_a$ value and/or roughness provides more robust and/or reliable solder connections, thereby providing more robust and/or reliable signal and/or power transmission between connections in the package on package (PoP) device 200.

In some implementations, a low $R_a$ value and/or roughness of the pad that is coupled to the solder interconnect 270 is possible because a laser is not used on the pad during the fabrication of the package on package (PoP) device 200. As will be further described below in detail, a low $R_a$ value and/or roughness of the pad that is coupled to the solder interconnect 270 can be achieved by providing solder on the pad (e.g., first pad 330) before forming the encapsulation layer 260 on the package interconnect 210.

Different implementations may provide the solder on the pad prior to forming the encapsulation layer 260 differently. For example, the solder may be formed on the pad through a printing process (e.g., solder on pad (SOP), coined SOP). In another example, the solder may be provided as a solder ball on the pad. Various examples of providing solder on the pad will be described in further details below.

Different implementations may use different packages as the top package (e.g., first package 202) in the package on package (PoP) device 200. For example, the top package of the package on package (PoP) device 200 may be a package from a group of packages comprising a fan out wafer level package (FOWLP), a wire bond chip scale package (CSP), and/or a flip chip chip scale package (CSP). Examples of a package on package (PoP) devices with a different combination of packages are further illustrated and described in FIGS. 11-13.

Figure 3:
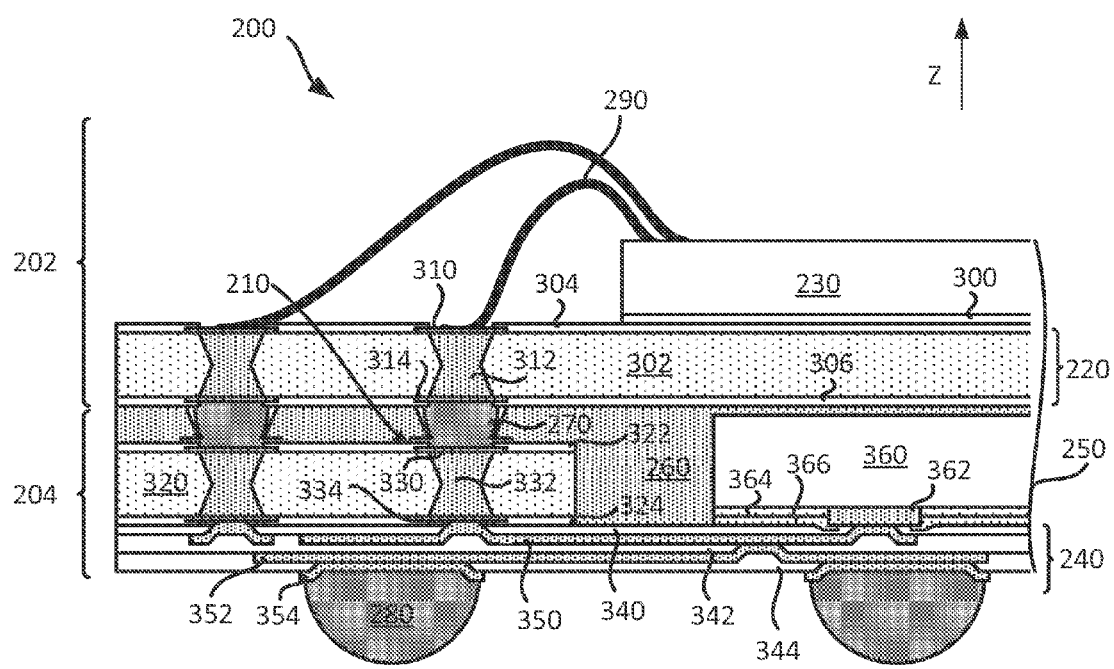
FIG. 3 illustrates a close up view of an example of a package on package (PoP) device with solder connections.

FIG. 2 illustrates a high level illustration of a package on package (PoP) device 200 that includes solder connections. FIG. 3 illustrates a close up view of the package on package (PoP) device 200 of FIG. 2.

As shown in FIG. 3, the package on package (PoP) device 200 includes the first package 202 (e.g., first integrated circuit device package) and the second package 204 (e.g., first integrated circuit device package). The first package 202 is coupled to the second package 204 through at least one solder interconnect 270 (e.g., at least one solder ball).

The first package 202 includes the first package substrate 220 and the first die 230. The first die 230 may be coupled to the first package substrate 220 through an adhesive 300. The first package substrate 220 includes a dielectric layer 302, a first solder resist layer 304, a second solder resist layer 306, a first pad 310, a first via 312, and a second pad 314. The wire bond 290 is coupled to the first die 230 and the first pad 310. The first pad 310 is coupled to the first via 312. The first via 312 traverses the dielectric layer 302. The first via 312 is coupled to the second pad 314. The second pad 314 is coupled to the solder interconnect 270.

The second package 204 (e.g., second integrated circuit device package) includes the package interconnect 210, the redistribution portion 240 (e.g., fan out portion), the second die 250, the encapsulation layer 260, and the solder ball 280. The second die 250 is coupled to the redistribution portion 240. The package interconnect 210 is coupled to the redistribution portion 240. The encapsulation layer 260 at least partially encapsulates the second die 250 and the package interconnect 210.

The package interconnect 210 includes a dielectric layer 320, a first solder resist layer 322, a second solder resist layer 324, a first pad 330, a first via 332, and a second pad 334. The first solder resist layer 322 and the second solder resist layer 324 may be optional. The second pad 334 is coupled to the first via 332. The first via 332 may traverse the dielectric layer 320. The first via 332 is coupled to the first pad 330. The first pad 330 is coupled to the solder interconnect 270. More specifically, a surface of the first pad 330 is coupled to the solder interconnect 270.

In some implementations, the surface of the first pad 330 that is coupled to the solder interconnect 270, has a smooth surface (e.g., not rough relative to pad that has been exposed to laser). In some implementations, the roughness of the surface of the first pad 330 that is coupled to the solder interconnect 270 has a $R_a$ value (surface roughness $R_a$ value) of about 1 micron (μm) or less. In some implementations, a low $R_a$ value and/or roughness provides more robust and/or reliable solder connections, thereby providing more a robust and/or reliable signal and/or power transmission between connections in the package on package (PoP) device 200.

As shown in FIG. 3, the redistribution portion 240 includes a first dielectric layer 340, a second dielectric layer 342, a third dielectric layer 344, a first redistribution layer 350, a second redistribution layer 352, an under bump metallization (UBM) layer 354, and the solder ball 280. The first redistribution layer 350 is coupled to the package interconnect 210 and the second die 250. More specifically, the first redistribution layer 350 is coupled to the second pad 334 of the package interconnect 210. The second redistribution layer 352 is coupled to the first redistribution layer 350. The UBM layer 354 is coupled to the second redistribution layer 352. The solder ball 280 is coupled to the UBM layer 354. In some implementations, the UBM layer 354 may be optional. In such instances, the solder ball 280 may be directly coupled to the second redistribution layer 352. It is noted that different implementations may have a different number of redistribution layers (e.g., one or more redistribution layers).

In some implementation, a redistribution layer (e.g. 350, 352), is a component that allows or facilitates an electrical connection between various points, elements and/or components. In some implementations, a redistribution layer (e.g. 350, 352) may include a trace, a via, and/or a pad. In some implementations, a redistribution layer (e.g. 350, 352) is an electrically conductive material that may provide an electrical path for a signal (e.g., data signal, ground signal, power signal). A redistribution layer (e.g. 350, 352) may include more than one element or component. A redistribution layer (e.g. 350, 352) may redistribute I/O pads of a die to other parts of the package.

In some implementations, the redistribution portion 240 is a part of the second package 204 that allows input/output (I/O) pads of a die (e.g., second die 250) to be available (e.g., fan out) in other locations of the second package 204. In some implementations, the first redistribution layer 350 and/or the second redistribution layer 352 redistribute the I/O pads of the second die 250 to other locations in the second package 204.

The second die 250 may include a substrate portion 360 (e.g., silicon substrate), a pad 362, a first passivation layer 364, and a second passivation layer 366. In some implementations, the pad 362 of the second die 250 is coupled to the first redistribution layer 350 of the redistribution portion 240. The second die 250 may be configured to be electrically coupled to the package interconnect 210 through the redistribution portion 240 (e.g., through at least one redistribution layer of the redistribution portion 240).

In some implementations, the first die 230 may be configured to be electrically coupled to the second die 250 through the wire bond 290, the first package substrate 220 (e.g., interconnects in the first package substrate 220), the solder interconnect 270, the package interconnect 210 (e.g., pads, vias, traces of the package interconnect 210), and the redistribution portion 240 (e.g., at least one redistribution layer of the redistribution portion 240).

In some implementations, the first die 230 has a height of about 50 microns (μm) or less. In some implementations, the second die 250 has a height of about 150 microns (μm) or less. In some implementations, the package interconnect 210 has a height of about 150 microns (μm). However, the package interconnect 210 may have a height that is greater or less than 150 microns (μm). In some implementations, the redistribution portion 240 has a height of about 40 microns (μm) or less. The PoP device 200 may have an X-Y dimension (e.g., lateral area and/or footprint) of about 5 mm×5 mm to 20 mm×20 mm (millimeter). The pitch of interconnects in the package interconnect 210 may be about 200 microns (μm) or less, where a pitch is a center to center distance between two adjacent interconnects (e.g., two adjacent pads). For example, the package interconnect 210 may include two adjacent vias. In some implementations, the pitch of the two adjacent vias in the package interconnect 210 may be about 200 microns (μm) or less. It is noted that the above exemplary dimensions may also be applicable to other package on package (PoP) devices described in the present disclosure.

In some implementations, the height of the package on package (PoP) device may be defined along the Z-direction of the package on package (PoP) device, which is shown in the figures of the present disclosure. In some implementations, the Z-direction of the package on package (PoP) device may be defined along an axis between a top portion and a bottom portion of the package on package (PoP) device. The terms top and bottom may be arbitrarily assigned, however as an example, the top portion of the device package may be a portion comprising the first die and/or wire bond, while a bottom portion of the package on package (PoP) device may be a portion comprising a redistribution portion or a plurality of solder balls. In some implementations, the top portion of the package on package (PoP) device may be a back side of the package on package (PoP) device, and the bottom portion of the package on package (PoP) device may be a front side of the package on package (PoP) device. The front side of the package on package (PoP) device may be an active side of the package on package (PoP) device. A top portion may be a higher portion relative to a lower portion. A bottom portion may be a lower portion relative to a higher portion.

In some implementations, the first package 202 may include a second encapsulation layer (not shown) that at least partially encapsulates the first die 230 and the wire bond 290.

Exemplary Sequence of Solder Coupling in a Package on Package (PoP) Device

Figure 4:
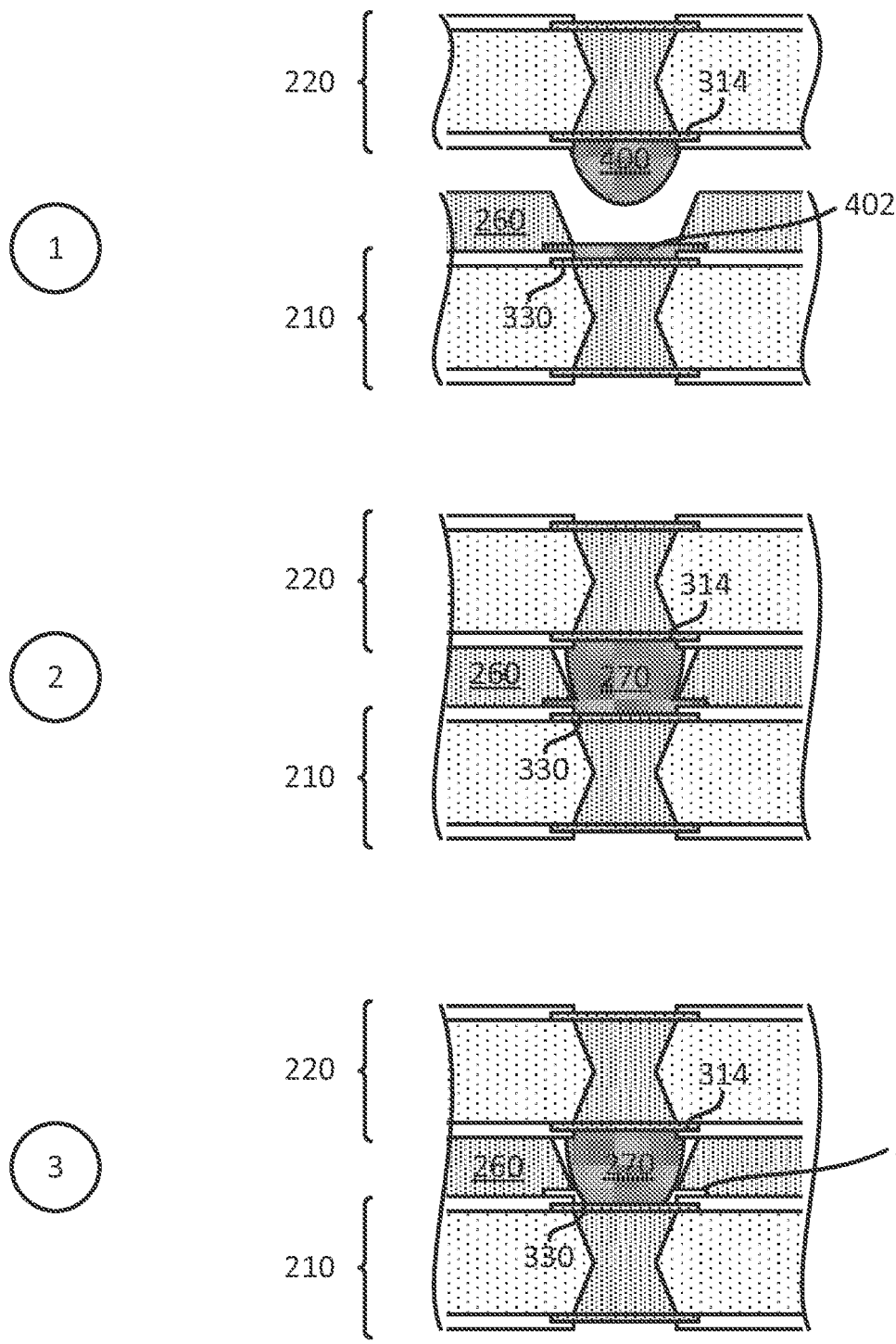
FIG. 4 illustrates a close up view of an example of a sequence for fabricating package on package (PoP) device with solder connections.

FIG. 4 illustrates an exemplary sequence of solder interconnect coupling in a package on package (PoP) device. FIG. 4 will be described in the context of coupling two packages to form the package on package (PoP) device 200 of FIGS. 2-3.

Stage 1 illustrates a state before the first package 202 (e.g., first integrated circuit device package) is coupled to the second package 204 (e.g., second integrated circuit device package). As shown at stage 1, a solder interconnect 400 is coupled to the second pad 314 of the first package substrate 220 of the first package 202.

Stage 1 also illustrates that a solder interconnect 402 is formed on the first pad 330 of the package interconnect 210. The solder interconnect 402 is also formed on the first solder resist layer 322. The encapsulation layer 260 encapsulates part of the solder interconnect 402. The solder interconnect 402 may be a coined solder on pad (SOP). In some implementations, the solder interconnect 402 is formed on the first pad 330 through a printing process (e.g., screen printing process). In some implementations, the solder interconnect 402 is provided (e.g., formed) on the first pad 330 and then coined so that the solder interconnect 402 is relatively flat.

Stage 2 illustrates a state after the first package 202 is coupled to the second package 204. As shown at stage 2, the solder interconnect 400 is touching the solder interconnect 402. In some implementations, the solder interconnect 400 has combined (e.g., mixed) with the solder interconnect 402. In some implementations, the combination of the solder interconnect 400 and the solder interconnect 402 is represented as the solder interconnect 270 of FIGS. 2-3.

Stage 3 illustrates a state after the solder interconnect 400 and the solder interconnect 402 have combined and set. In some implementations, the combination of the solder interconnect 400 and the solder interconnect 402 is represented as the solder interconnect 270 of FIGS. 2-3. As shown at stage 3, some or all of the solder interconnect 402 that was encapsulated by the encapsulation layer 260 has seeped out to combine with the solder interconnect 400. The result of the solder interconnect 402 being seeped out has left a cavity 410 in the encapsulation layer 260. The cavity 410 is located between the first pad 330 and the encapsulation layer 260. The cavity 410 may also be located between the first solder resist layer 322 and the encapsulation layer 260. As shown in stage 3, the cavity 410 in the encapsulation layer 260 has at least part of the shape of the solder interconnect 402 prior to the coupling of the packages. Stage 3 also illustrates that the cavity in the encapsulation layer 260 in which the solder interconnect 402 is located has a non-U shape profile or non-V shape profile. In some implementations, the side walls of the cavity (e.g., cavity 410) in which the solder interconnect 402 is located is non-linear.

Exemplary Sequence of Solder Coupling in a Package on Package (PoP) Device

Figure 5:
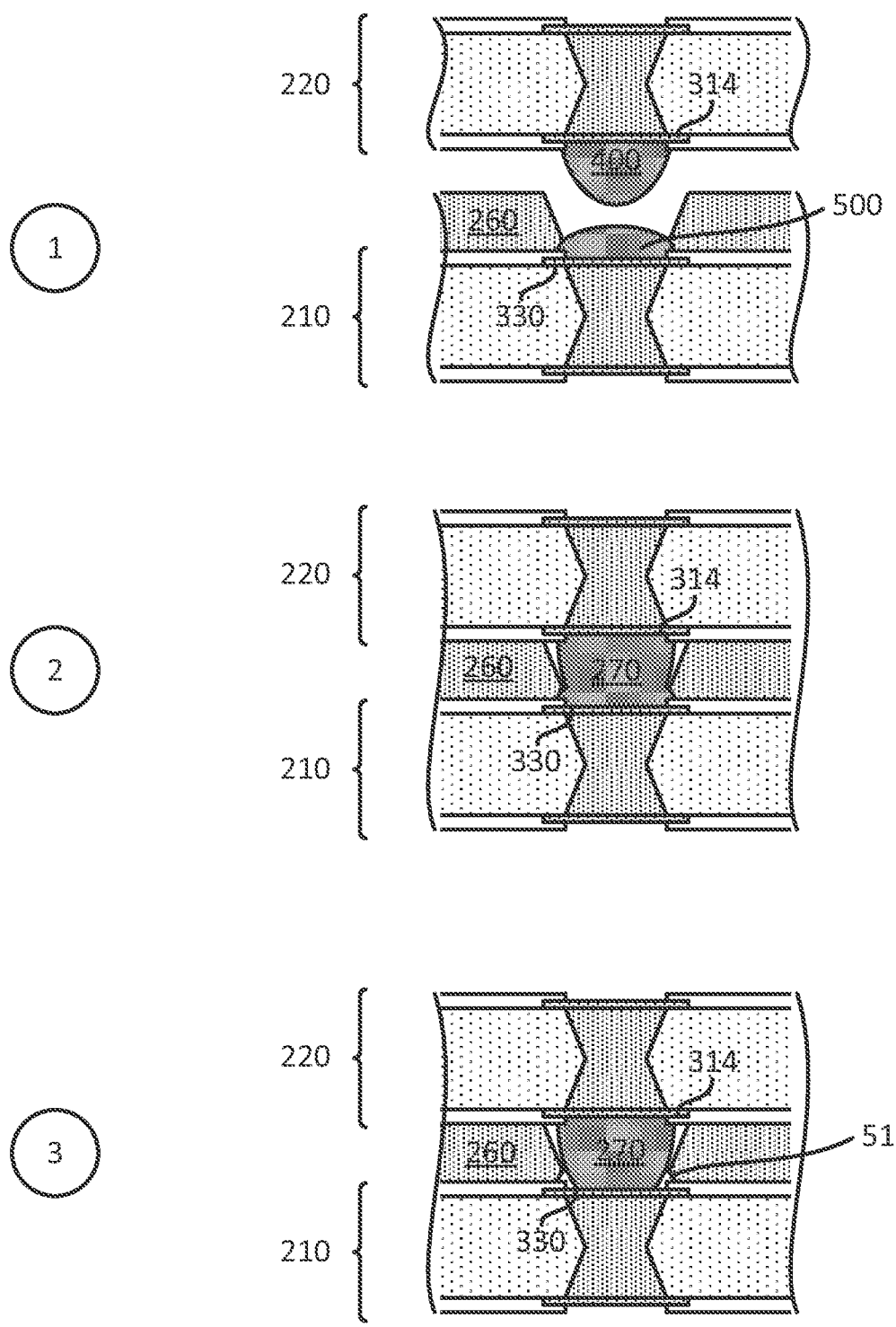
FIG. 5 illustrates a close up view of another example of a sequence for fabricating package on package (PoP) device with solder connections.

FIG. 5 illustrates another exemplary sequence of solder coupling in a package on package (PoP) device. FIG. 5 is similar to FIG. 4, except that FIG. 5 illustrates a solder interconnect that is formed differently on the pad of the package interconnect. FIG. 5 will be described in the context of coupling two packages to form the package on package (PoP) device 200 of FIGS. 2-3.

Stage 1 illustrates a state before the first package 202 (e.g., first integrated circuit device package) is coupled to the second package 204 (e.g., second integrated circuit device package). As shown at stage 1, a solder interconnect 400 is coupled to the second pad 314 of the first package substrate 220 of the first package 202.

Stage 1 also illustrates that a solder interconnect 500 is formed on the first pad 330 of the package interconnect 210. The solder interconnect 500 is also formed on the first solder resist layer 322. The encapsulation layer 260 encapsulates part of the solder interconnect 500. In some implementations, the solder interconnect 500 is provided in a similar manner as the solder interconnect 402, except that the solder interconnect 500 is not coined to be flat.

Stage 2 illustrates a state after the first package 202 is coupled to the second package 204. As shown at stage 2, the solder interconnect 400 is touching the solder interconnect 500. In some implementations, the solder interconnect 400 has combined (e.g., mixed) with the solder interconnect 500. In some implementations, the combination of the solder interconnect 400 and the solder interconnect 500 is represented as the solder interconnect 270 of FIGS. 2-3.

Stage 3 illustrates a state after the solder interconnect 400 and the solder interconnect 500 have combined and set. In some implementations, the combination of the solder interconnect 400 and the solder interconnect 500 is represented as the solder interconnect 270 of FIGS. 2-3. As shown at stage 3, some or all of the solder interconnect 500 that was encapsulated by the encapsulation layer 260 has seeped out to combine with the solder interconnect 400. The result of the solder interconnect 500 being seeped out has left a cavity 510 in the encapsulation layer 260. The cavity 510 is located between the first pad 330 and the encapsulation layer 260. The cavity 510 may also be located between the first solder resist layer 322 and the encapsulation layer 260. As shown in stage 3, the cavity 510 in the encapsulation layer 260 has at least part of the shape of the solder interconnect 500 prior to the coupling of the packages. Stage 3 also illustrates that the cavity in the encapsulation layer 260 in which the solder interconnect 500 is located has a non-U shape profile or non-V shape profile. In some implementations, the side walls of the cavity (e.g., cavity 510) in which the solder interconnect 500 is located is non-linear.

Exemplary Sequence of Solder Coupling in a Package on Package (PoP) Device

Figure 6:
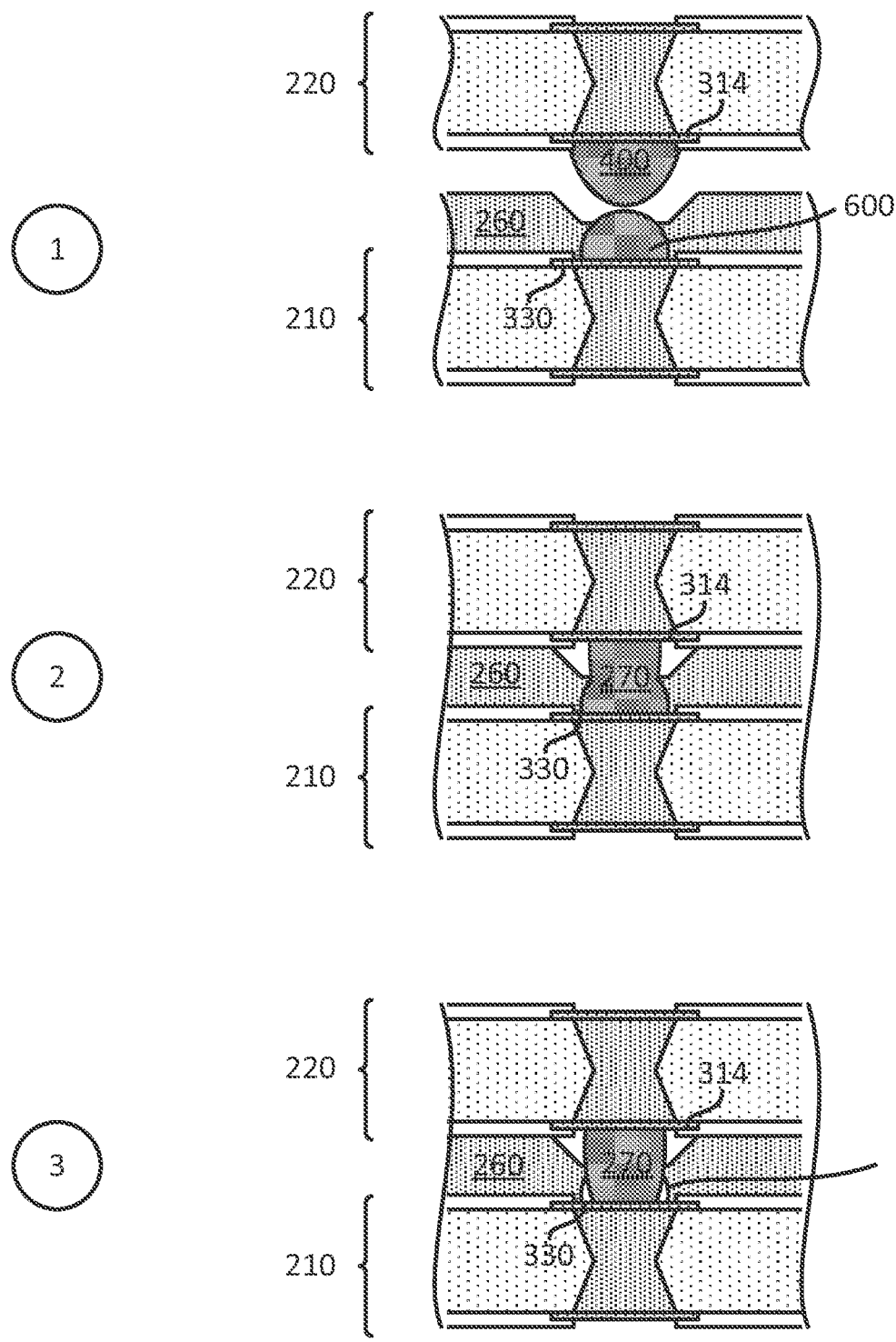
FIG. 6 illustrates a close up view of an example of a sequence for fabricating package on package (PoP) device with solder connections.

FIG. 6 illustrates another exemplary sequence of solder interconnect coupling in a package on package (PoP) device. FIG. 6 is similar to FIG. 4, except that FIG. 6 illustrates a solder that is formed differently on the pad of the package interconnect. FIG. 6 will be described in the context of coupling two packages to form the package on package (PoP) device 200 of FIGS. 2-3.

Stage 1 illustrates a state before the first package 202 (e.g., first integrated circuit device package) is coupled to the second package 204 (e.g., second integrated circuit device package). As shown at stage 1, a solder interconnect 400 is coupled to the second pad 314 of the first package substrate 220 of the first package 202.

Stage 1 also illustrates that a solder interconnect 600 is formed on the first pad 330 of the package interconnect 210. The solder interconnect 600 is also formed on the first solder resist layer 322. The encapsulation layer 260 encapsulates part of the solder interconnect 600. In some implementations, the solder interconnect 600 is provided (e.g., formed) by dropping a preformed solder ball on the first pad 330.

Stage 2 illustrates a state after the first package 202 is coupled to the second package 204. As shown at stage 2, the solder interconnect 400 is touching the solder interconnect 600. In some implementations, the solder interconnect 400 has combined (e.g., mixed) with the solder interconnect 600. In some implementations, the combination of the solder interconnect 400 and the solder interconnect 600 is represented as the solder interconnect 270 of FIGS. 2-3.

Stage 3 illustrates a state after the solder interconnect 400 and the solder interconnect 600 have combined and set. In some implementations, the combination of the solder interconnect 400 and the solder interconnect 600 is represented as the solder interconnect 270 of FIGS. 2-3. As shown at stage 3, some or all of the solder interconnect 600 that was encapsulated by the encapsulation layer 260 has seeped out to combine with the solder interconnect 400. The result of the solder interconnect 600 being seeped out has left a cavity 610 in the encapsulation layer 260. The cavity 610 is located between the first pad 330 and the encapsulation layer 260. The cavity 610 may also be located between the first solder resist layer 322 and the encapsulation layer 260. As shown in stage 3, the cavity 610 in the encapsulation layer 260 has at least part of the shape of the solder interconnect 600 prior to the coupling of the packages. Stage 3 also illustrates that the cavity in the encapsulation layer 260 in which the solder interconnect 600 is located has a non-U shape profile or non-V shape profile. In some implementations, the side walls of the cavity (e.g., cavity 610) in which the solder interconnect 600 is located is non-linear.

Exemplary Solder Comprising Different Properties

Figure 7:
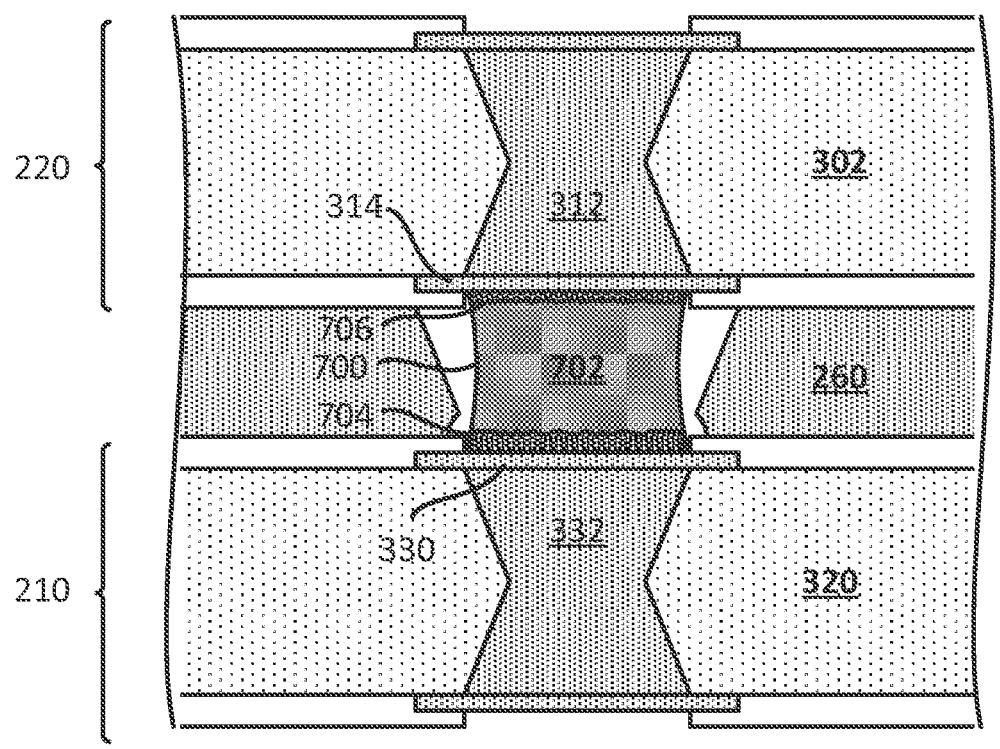
FIG. 7 illustrates a close up view of an example of solder connections in a package on package (PoP) device.

In some implementations, a solder interconnect that couples two packages in a package on package (PoP) device may form two materials with different properties. FIG. 7 illustrates a solder interconnect 700 that includes two materials with different properties. In some implementations, the solder interconnect 700 may represent the solder interconnect 270. The solder interconnect 700 couples the second pad 314 of the first package 202 to the first pad 330 of the second package 204. In some implementations, the solder interconnect 700 may represent the solder interconnect 270 of FIGS. 2-3. As shown in FIG. 7, the solder interconnect 700 includes a first portion 702, a second portion 704, and a third portion 706. The second portion 704 is coupled to the first pad 330. The second portion 704 is coupled to the first portion 702. The first portion 702 is coupled to the third portion 706. The third portion 706 is coupled to the second pad 314. The first portion 702 has a first property, the second portion 704 has a second property (e.g., second intermetallic discernability), and the third portion 706 has a third property (e.g., third intermetallic discernability). The first portion 702 may be solder interconnect, the second portion 704 may be a first intermetallic material, and the third portion 706 may be a second intermetallic material. The first intermetallic material and the second intermetallic material may be a solder copper intermetallic. In some implementations, the second portion 704 may be a thicker intermetallic material than the third portion 706. This may be due to the fact that the second portion 704 of the solder interconnect 700 goes through two (2) reflow processes, while the third portion 706 of the solder interconnect 700 goes through one (1) reflow process. In some implementations, the second portion 704 may be at least about 1.5 times thicker than the third portion 706.

Exemplary Sequence for Fabricating a Package on Package (PoP) Device Comprising Solder Connections In some implementations, providing/fabricating a package on package (PoP) device that includes solder connections includes several processes. FIG. 8 illustrates an exemplary sequence for providing/fabricating an package on package (PoP) device that includes solder connections. In some implementations, the sequence of FIG. 8 may be used to provide/fabricate the package on package (PoP) device of FIGS. 2-3 and/or other package on package (PoP) devices described in the present disclosure. However, for the purpose of simplification, FIG. 8 will be described in the context of providing/fabricating the package on package (PoP) device of FIG. 3.

It should be noted that the sequence of FIG. 8 may combine one or more stages in order to simplify and/or clarify the sequence for providing a package on package (PoP) device. In some implementations, the order of the processes may be changed or modified.

Figure 8A:
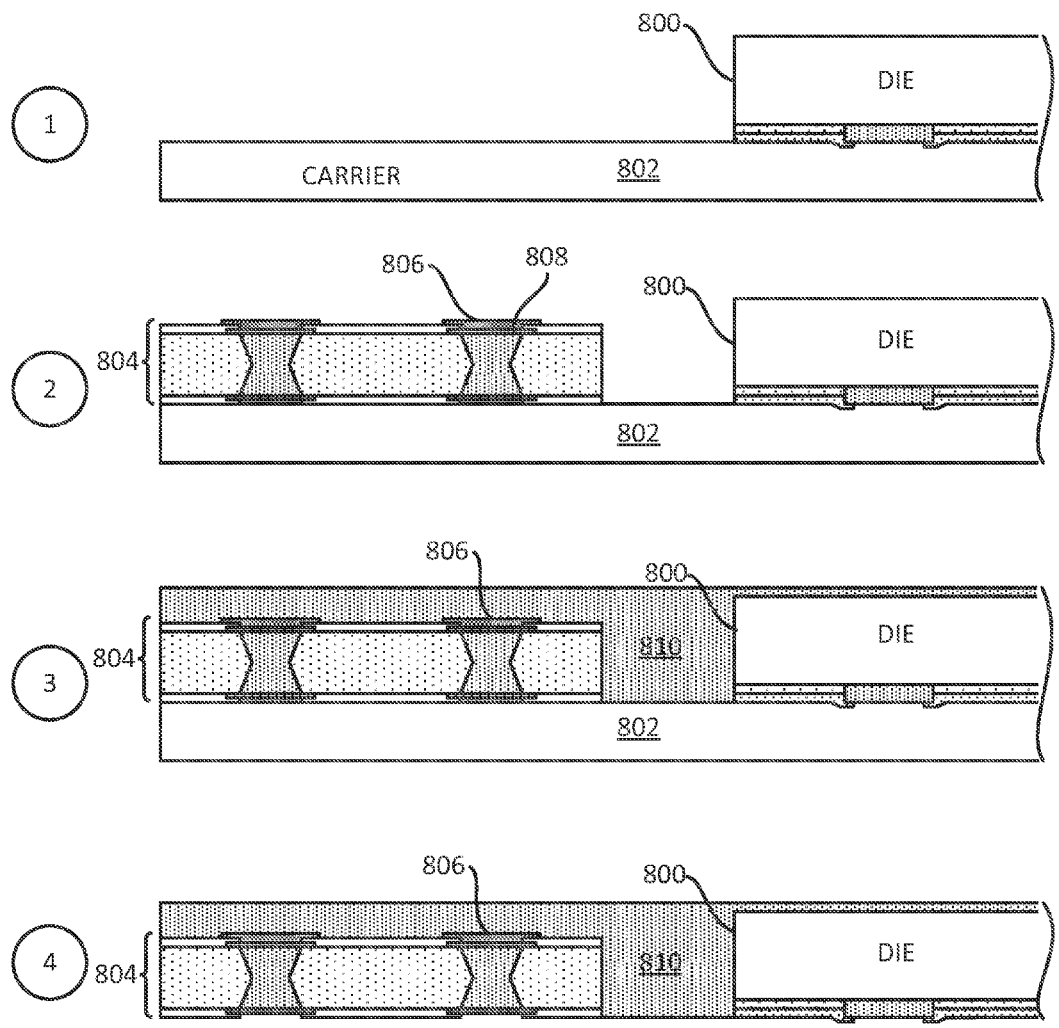
FIG. 8 (which comprises FIGS. 8A-8C) illustrates an example of a sequence for fabricating a package on package (PoP) device with solder connections.

Stage 1, as shown in FIG. 8A, illustrates a state after a die 800 is coupled (e.g., placed) to a carrier 802. The die 800 may be identical and/or similar to the second die 250 of FIG. 3. The die 800 may be a logic die and/or a memory die. The die 800 may include a substrate portion (e.g., silicon substrate), a pad, a first passivation layer, and a second passivation layer, as described for the second die 250 in FIG. 3.

Stage 2 illustrates a state after a package interconnect 804 is coupled (e.g., placed) to the carrier 802. The package interconnect 804 may be identical and/or similar to the package interconnect 210 of FIG. 3. The package interconnect 804 includes a first solder interconnect 806 and a first pad 808. The first solder interconnect 806 is coupled to the first pad 808. The first solder interconnect 806 may be solder on pad (SOP) (e.g., coined SOP). In some implementations, the first solder interconnect 806 is formed by using a printing process (e.g., screen printing process).

Stage 3 illustrates a state after an encapsulation layer 810 is formed on the die 800 and the package interconnect 804. The encapsulation layer 810 is formed such that the encapsulation layer 810 at least partially encapsulates the die 800 and the package interconnect 804. Stage 3 illustrates that the encapsulation layer 810 at least partially encapsulates the first solder interconnect 806.

Stage 4 illustrates a state after the carrier 802 is removed from the die 800, the package interconnect 804, and the encapsulation layer 810.

Figure 8B:
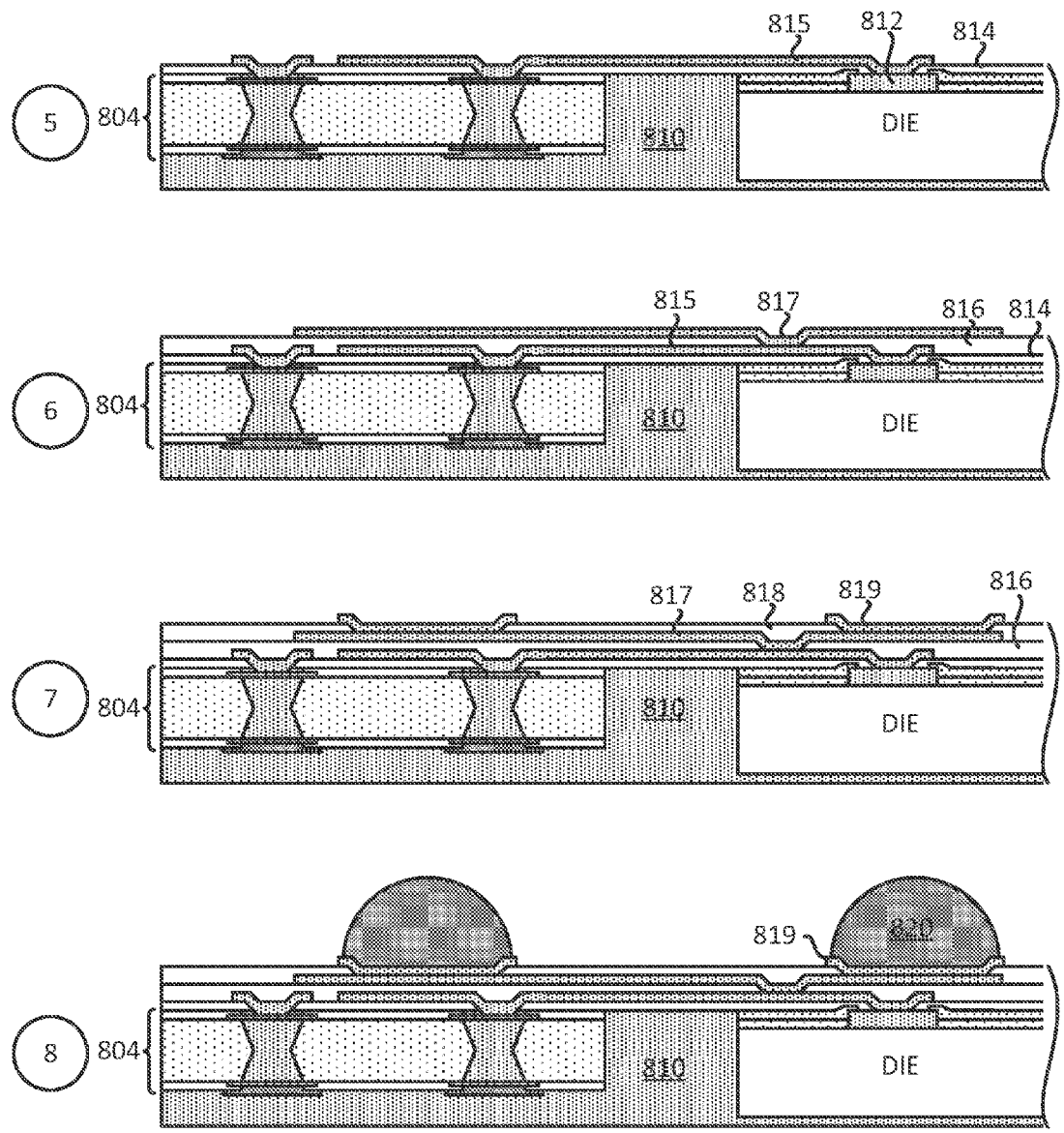

Stage 5, as shown in FIG. 8B, illustrates a state after a first dielectric layer 814 and a first redistribution layer 815 are formed. The first dielectric layer 814 may be formed on a passivation layer of the die 800 and a solder resist layer of the package interconnect 804. The first redistribution layer 815 is formed such that the first redistribution layer 815 is coupled to the pad 812 of the die 800 and the package interconnect 804.

Stage 6 illustrates a state after a second dielectric layer 816 and a second redistribution layer 817 are formed. The second dielectric layer 816 may be formed on the first dielectric layer 814. The second redistribution layer 817 is formed such that the second redistribution layer 817 is coupled to the first redistribution layer 815.

Stage 7 illustrates a state after a third dielectric layer 818 and an under bump metallization (UBM) layer 819 are formed. The third dielectric layer 818 may be formed on the second dielectric layer 816. The UBM layer 819 is formed such that the UBM layer 819 is coupled to the second redistribution layer 817.

Stage 8 illustrates a state after a solder ball 820 is coupled to the UBM layer 819. In some implementations, the UBM layer 819 is optional. In such instances, the solder ball 820 may be directly coupled to the second redistribution layer 817.

Figure 8C:
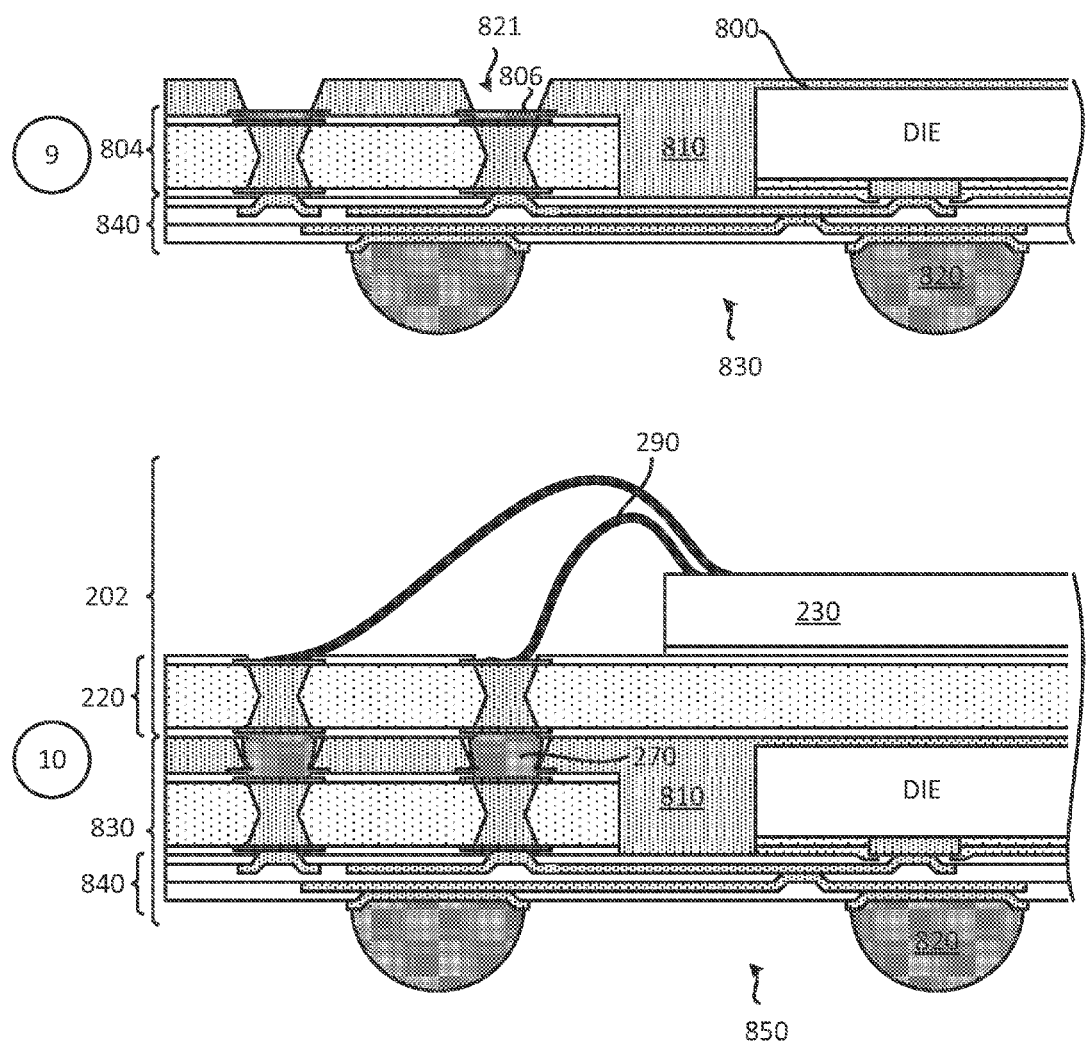

Stage 9, as shown in FIG. 8C, illustrates a state after the first solder interconnect 806 is exposed by removing portions of the encapsulation layer 810. In some implementations, a laser process (e.g., laser ablation) is used to remove portions of the encapsulation layer 810. Since the first solder interconnect 806 covers the first 808 pad on the package interconnect 804, the laser process does not damage the first pad 808 or make the pad surface rougher, thus preserving the smoothness of the surface of the first pad 808 coupled to the first solder interconnect 806. As shown at stage 9, a cavity 821 is formed in the encapsulation layer 810 over the first solder interconnect 806. Stage 9 in some implementations, illustrates a package 830 that includes the die 800, the package interconnect 804, the encapsulation layer 810, and a redistribution portion 840.

Stage 10 illustrates a state after the first package 202 is coupled to the package 830 through the solder the at least one solder interconnect 270. The at least one solder interconnect 270 may include the first solder interconnect 806. The first package 202 includes the first package substrate 220, the first die 230 and the wire bond 290. Stage 10 illustrates in some implementations, a package on package (PoP) device 850 that includes the first package 202 and the package 830, where the package 830 includes the die 800, the package interconnect 804, the redistribution portion 840, and the encapsulation layer 810. The package interconnect 804 includes the first pad 808 and the first solder interconnect 806, where the first pad 808 includes a surface coupled to the first solder interconnect 806. The surface of the first pad 808 that is coupled to the first solder interconnect 806 has a surface roughness $R_a$ value that is about 1 micron (μm) or less.

Exemplary Sequence for Fabricating a Package on Package (PoP) Device Comprising Solder Connections In some implementations, providing/fabricating a package on package (PoP) device that includes solder connections includes several processes. FIG. 9 illustrates an exemplary sequence for providing/fabricating an package on package (PoP) device that includes solder connections. In some implementations, the sequence of FIG. 9 may be used to provide/fabricate the package on package (PoP) device of FIGS. 2-3 and/or other package on package (PoP) devices described in the present disclosure. However, for the purpose of simplification, FIG. 9 will be described in the context of providing/fabricating the package on package (PoP) device of FIG. 3.

It should be noted that the sequence of FIG. 9 may combine one or more stages in order to simplify and/or clarify the sequence for providing an package on package (PoP) device. In some implementations, the order of the processes may be changed or modified.

Figure 9A:
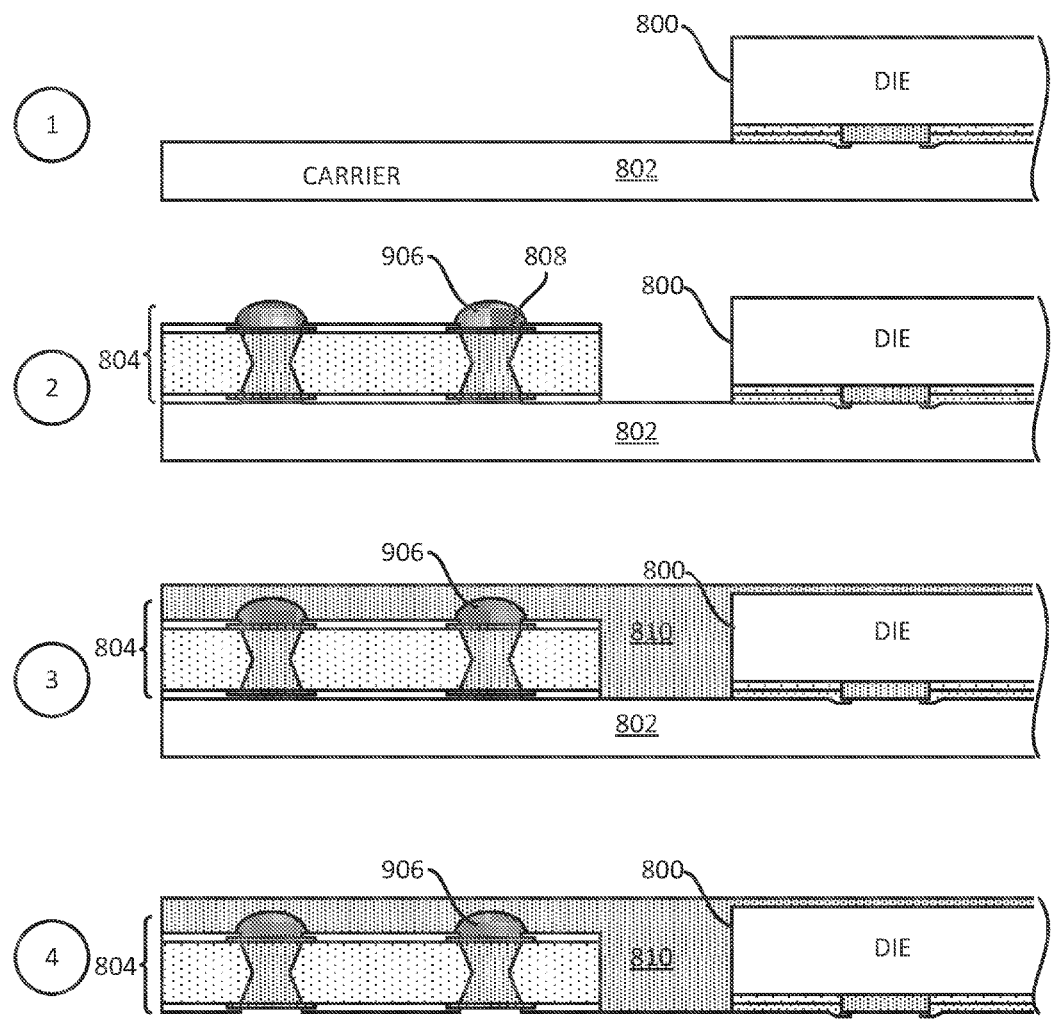
FIG. 9 (which comprises FIGS. 9A-9C) illustrates an example of a sequence for fabricating a package on package (PoP) device with solder connections.

Stage 1, as shown in FIG. 9A, illustrates a state after a die 800 is coupled (e.g., placed) to a carrier 802. The die 800 may be identical and/or similar to the second die 250 of FIG. 3. The die 800 may be a logic die and/or a memory die. The die 800 may include a substrate portion (e.g., silicon substrate), a pad, a first passivation layer, and a second passivation layer, as described for the second die 250 in FIG. 3

Stage 2 illustrates a state after a package interconnect 804 is coupled (e.g., placed) to the carrier 802. The package interconnect 804 may be identical and/or similar to the package interconnect 210 of FIG. 3. The package interconnect 804 includes a first solder interconnect 906 and a first pad 808. The first solder interconnect 906 is coupled to the first pad 808. The first solder interconnect 906 may be solder on pad (SOP) or a solder ball.

Stage 3 illustrates a state after an encapsulation layer 810 is formed on the die 800 and the package interconnect 804. The encapsulation layer 810 is formed such that the encapsulation layer 810 at least partially encapsulates the die 800 and the package interconnect 804. Stage 3 illustrates that the encapsulation layer 810 at least partially encapsulates the first solder interconnect 906.

Stage 4 illustrates a state after the carrier 802 is removed from the die 800, the package interconnect 804, and the encapsulation layer 810.

Figure 9B:
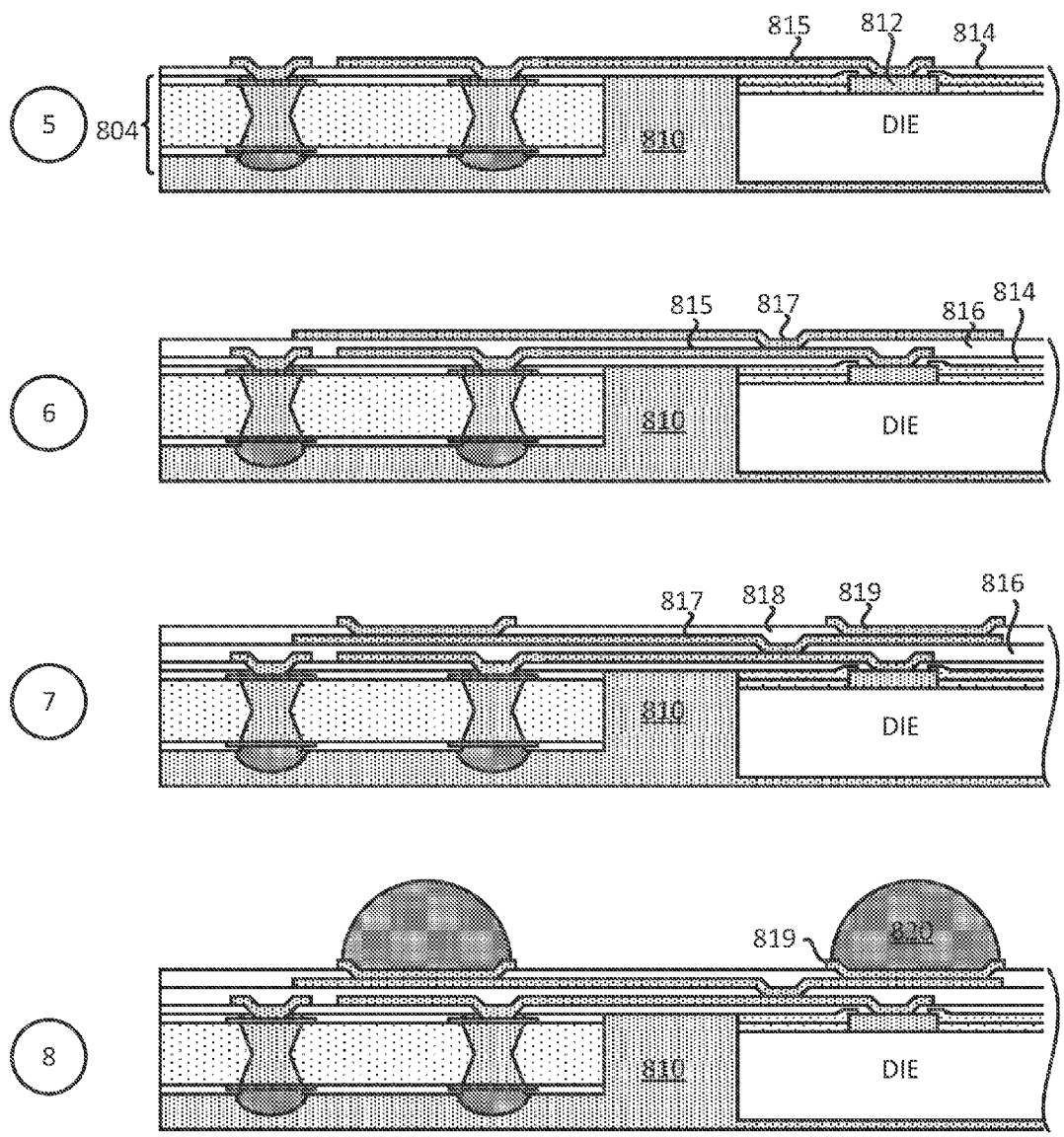

Stage 5, as shown in FIG. 9B, illustrates a state after a first dielectric layer 814 and a first redistribution layer 815 are formed. The first dielectric layer 814 may be formed on a passivation layer of the die 800 and a solder resist layer of the package interconnect 804. The first redistribution layer 815 is formed such that the first redistribution layer 815 is coupled to the pad 812 of the die 800 and the package interconnect 804.

Stage 6 illustrates a state after a second dielectric layer 816 and a second redistribution layer 817 are formed. The second dielectric layer 816 may be formed on the first dielectric layer 814. The second redistribution layer 817 is formed such that the second redistribution layer 817 is coupled to the first redistribution layer 815.

Stage 7 illustrates a state after a third dielectric layer 818 and an under bump metallization (UBM) layer 819 are formed. The third dielectric layer 818 may be formed on the second dielectric layer 816. The UBM layer 819 is formed such that the UBM layer 819 is coupled to the second redistribution layer 817.

Stage 8 illustrates a state after a solder ball 820 is coupled to the UBM layer 819. In some implementations, the UBM layer 819 is optional. In such instances, the solder ball 820 may be directly coupled to the second redistribution layer 817.

Figure 9C:
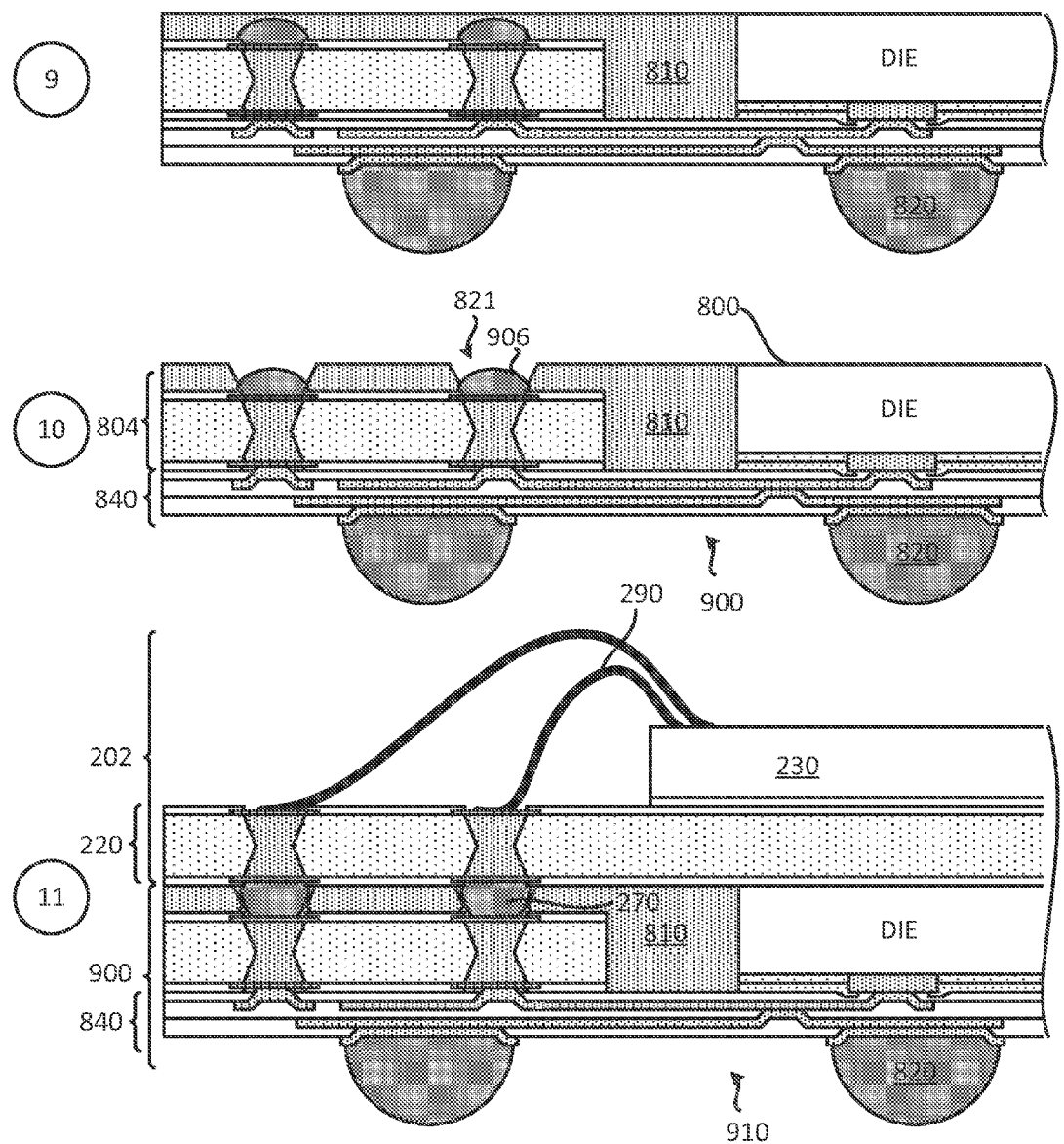

Stage 9, as shown in FIG. 9C, illustrates a state after a portion of the encapsulation layer 810 is removed. In some implementations, a grinding process may be used to remove portions of the encapsulation layer 810.

Stage 10 illustrates a state after the first solder interconnect 906 is exposed by removing portions of the encapsulation layer 810. In some implementations, a laser process (e.g., laser ablation) is used to remove portions of the encapsulation layer 810. Since the first solder interconnect 906 covers the first pad 808 on the package interconnect 804, the laser process does not damage the first pad 808 or make the pad surface rougher, thus preserving the smoothness of the surface of the first pad 808 coupled to the first solder interconnect 906. As shown at stage 10, a cavity 821 is formed in the encapsulation layer 810 over the first solder interconnect 906. Stage 9 in some implementations, illustrates a package 900 that includes the die 800, the package interconnect 804, the encapsulation layer 810, and a redistribution portion 840.

Stage 11 illustrates a state after the first package 202 is coupled to the package 900 through the solder the at least one solder interconnect 270. The at least one solder interconnect 270 may include the first solder interconnect 906. The first package 202 includes the first package substrate 220, the first die 230 and the wire bond 290. Stage 11 illustrates in some implementations, a package on package (PoP) device 910 that includes the first package 202 and the package 900, where the package 900 includes the die 800, the package interconnect 804, the redistribution portion 840, and the encapsulation layer 810. The package interconnect 804 includes the first pad 808 and the first solder interconnect 906, where the first pad 808 includes a surface coupled to the first solder interconnect 906. The surface of the first pad 808 that is coupled to the first solder interconnect 906 has a surface roughness $R_a$ value that is about 1 micron (μm) or less.

Figure 10:
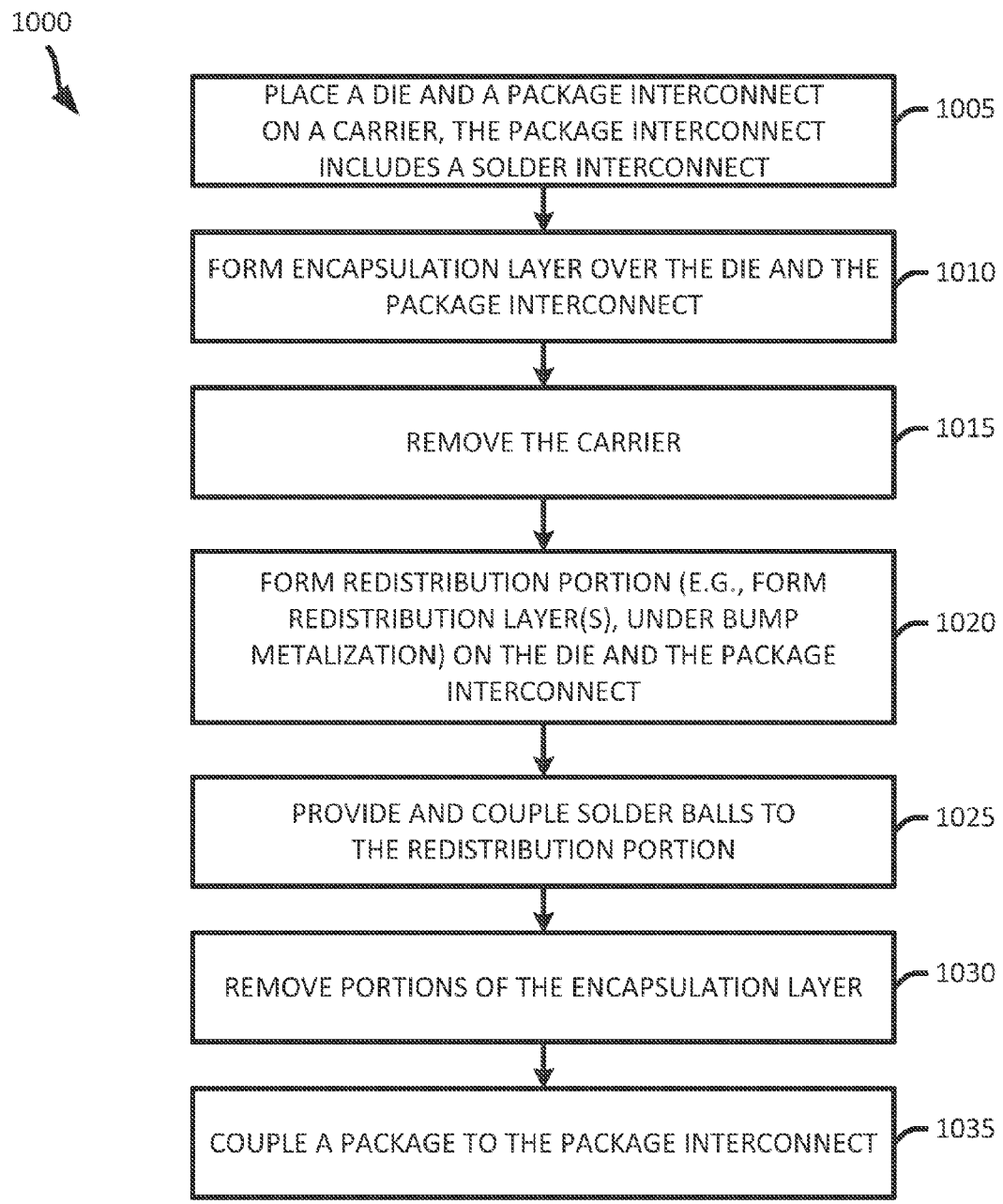
FIG. 10 illustrates a flow diagram of an example of a method for fabricating a package on package (PoP) device with solder connections.

Exemplary Method for Fabricating a Package on Package (PoP) Device Comprising Solder Connections In some implementations, providing/fabricating a package on package (PoP) device that includes solder connections includes several processes. FIG. 10 illustrates an exemplary flow diagram of a method for providing/fabricating an package on package (PoP) device that includes solder connections. In some implementations, the method of FIG. 10 may be used to provide/fabricate the package on package (PoP) device of FIGS. 2-3 and/or other package on package (PoP) devices described in the present disclosure. However, for the purpose of simplification, FIG. 10 will be described in the context of providing/fabricating the package on package (PoP) device of FIG. 3.

It should be noted that the flow diagram of FIG. 10 may combine one or more processes in order to simplify and/or clarify the method for providing a package on package (PoP) device. In some implementations, the order of the processes may be changed or modified.

The method places (at 1005) a die and a package interconnect on a carrier (e.g., carrier 802). The die may be identical and/or similar to the second die 250 of FIG. 3. The die may be a logic die and/or a memory die. The die may include a substrate portion (e.g., silicon substrate), a pad, a first passivation layer, and a second passivation layer, as described for the second die 250 in FIG. 3. The package interconnect may be identical and/or similar to the package interconnect 210 of FIG. 3. The package interconnect includes a first pad (e.g., first pad 808) and a first solder interconnect (e.g., first solder interconnect 806). The first solder interconnect is coupled to the first pad. The first solder interconnect (e.g., first solder interconnect 806) may be solder on pad (SOP) (e.g., coined SOP) or a solder ball.

The method forms (at 1010) an encapsulation layer on the die and the package interconnect. The encapsulation layer (e.g., encapsulation layer 810) is formed such that the encapsulation layer at least partially encapsulates the die (e.g., die 800) and the package interconnect (e.g., package interconnect 804). The encapsulation layer may also encapsulate the solder interconnect.

The method then removes (at 1015) the carrier from the die, the package interconnect, and the encapsulation layer.

The method forms (at 1020) a redistribution portion (e.g., redistribution portion 840) on the die and the package interconnect. In some implementations, forming the redistribution portion includes forming a first dielectric layer, forming a first redistribution layer (e.g., first redistribution layer 815), forming a second dielectric layer forming a second redistribution layer (e.g., second redistribution layer 817), forming a third dielectric layer and/or forming an under bump metallization (UBM) layer (e.g., UBM layer 819).

The method provides and couples (at 1025) a solder ball (e.g., solder ball 820) to the redistribution portion (e.g., coupling a solder ball to a UBM layer).

The method removes (at 1030) a portion of the encapsulation layer. In some implementations, removing a portion of the encapsulation layer includes using a laser process (e.g., laser ablation) to remove portions of the encapsulation layer and expose the solder interconnect (e.g., solder interconnect) previously encapsulated by the encapsulation layer. In some implementations, removing a portion of the encapsulation layer may optionally include grinding a portion of the encapsulation layer.

The method couples (at 1035) a first package (e.g., first package 202) to the package interconnect to form a package on package (PoP) device. In some implementations, a solder ball (e.g., solder interconnect 400) from the first package is coupled to the solder interconnect (e.g., first solder interconnect 806) coupled to the pad of the package interconnect. The solder ball and the solder interconnect may form a solder interconnect (e.g., solder interconnect 270). In some implementations, the surface of the pad that is coupled to the solder interconnect (e.g., first solder interconnect 806) has a surface roughness $R_a$ value that is about 1 micron (μm) or less.

Exemplary Package on Package (PoP) Devices Comprising Solder Connections

Figure 11:
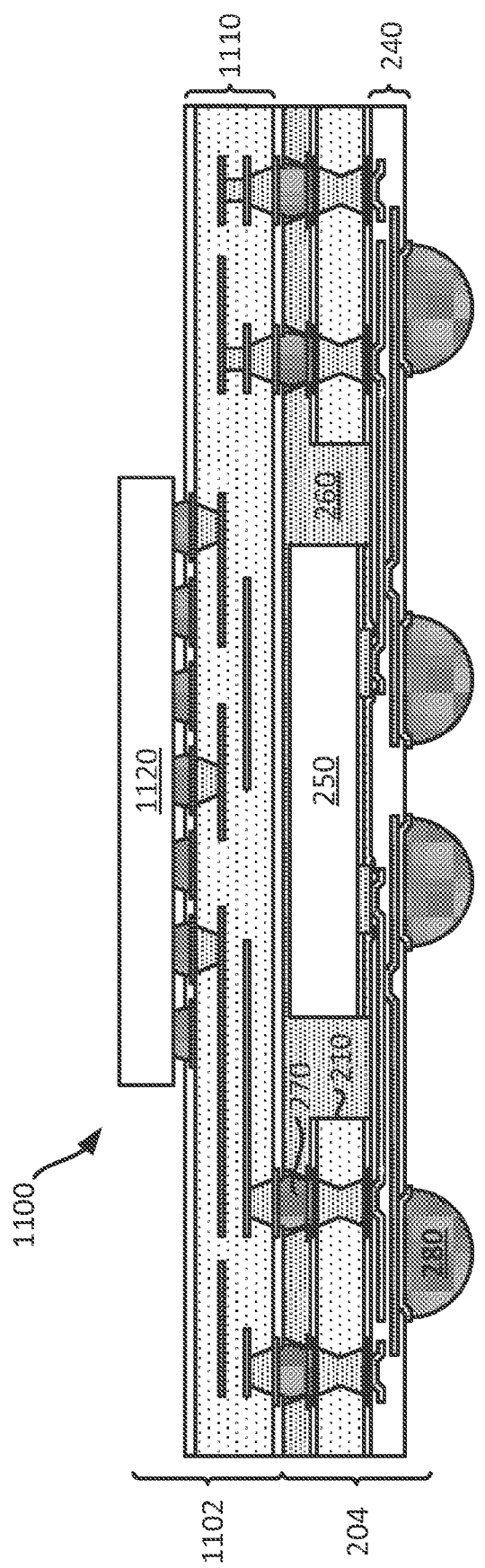
FIG. 11 illustrates an example of another package on package (PoP) device with solder connections.
Figure 12:
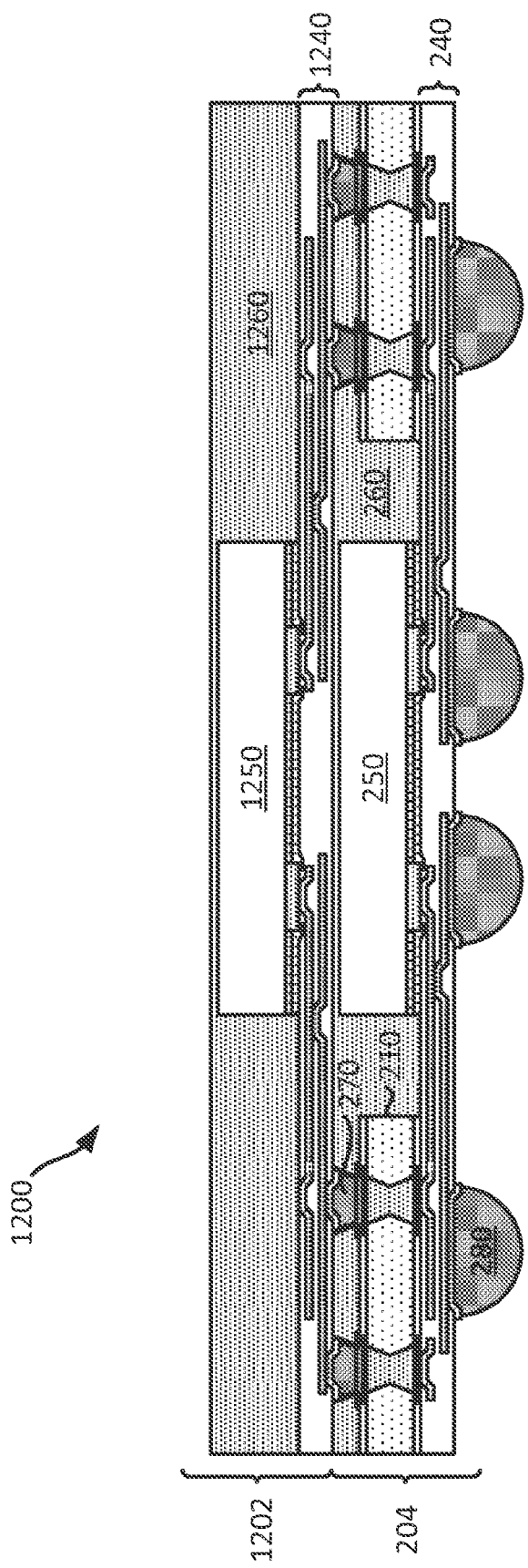
FIG. 12 illustrates an example of another package on package (PoP) device with solder connections.
Figure 13:
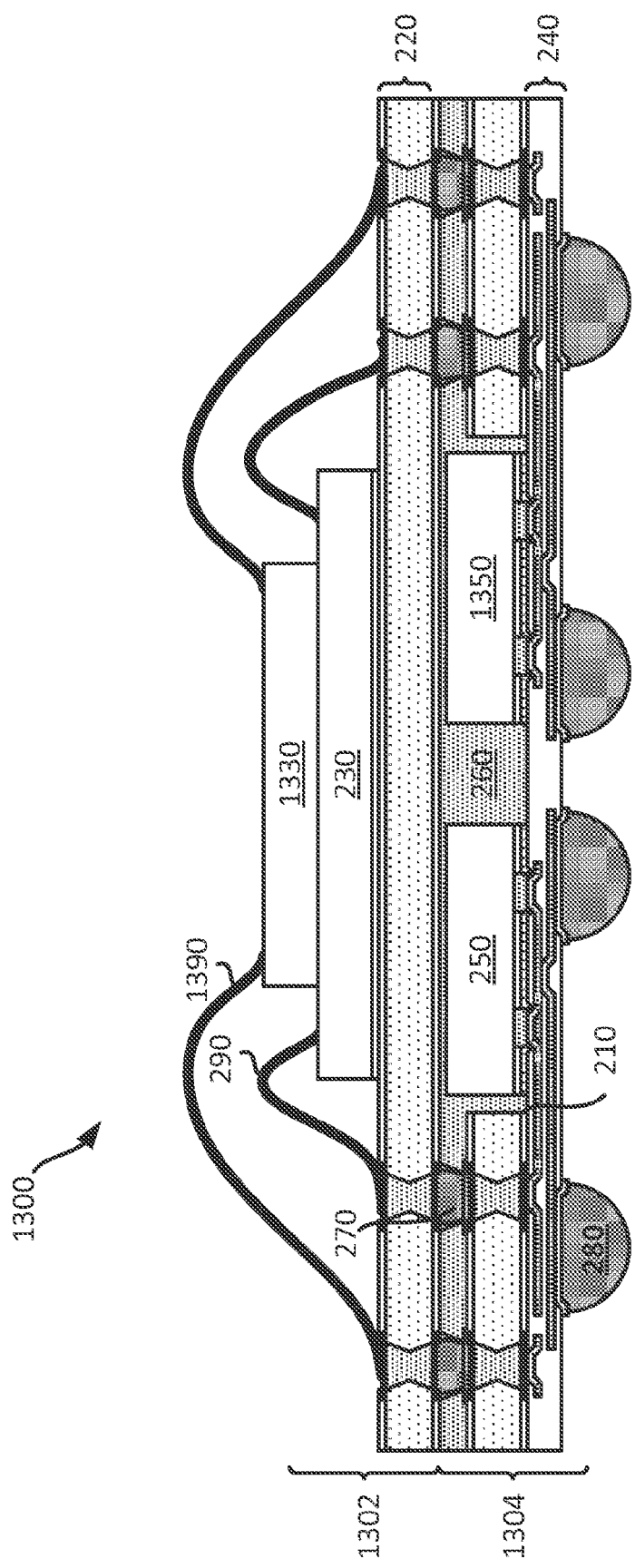
FIG. 13 illustrates an example of another package on package (PoP) device with solder connections.

As mentioned above, different implementations may use different packages as the top package in the package on package (PoP) device 200. For example, the top package of a package on package (PoP) device may include a fan out wafer level package (FOWLP), a wire bond chip scale package, and/or a flip chip chip scale package. In some implementations, several top packages may be formed on a bottom package to form a package on package (PoP) device. FIGS. 11-13 illustrate examples of different package on package (PoP) devices with different package combinations.

FIG. 11 illustrates a package on package (PoP) device 1100 that includes a first package 1102 (e.g., first integrated circuit device package) and the second package 204 (e.g., second integrated circuit device package), where the first package 1102 is coupled to the second package 204 through at least one solder interconnect 270.

The package on package (PoP) device 1100 is similar to the package on package (PoP) device 200, except that the first package 202 has been replaced with the first package 1102. The first package 1102 (e.g., first integrated circuit device package) includes a first package substrate 1110 and a first die 1120. The first package substrate 1110 includes several metal layers. The first die 1120 may be a flip chip die.

FIG. 12 illustrates a package on package (PoP) device 1200 that includes a first package 1202 (e.g., first integrated circuit device package) and the second package 204 (e.g., second integrated circuit device package), where the first package 1202 is coupled to the second package 204 through at least one solder interconnect 270.

The package on package (PoP) device 1200 is similar to the package on package (PoP) device 200, except that the first package 202 has been replaced with the first package 1202. The first package 1202 (e.g., first integrated circuit device package) may be a fan out wafer level package (FOWLP) that includes a second redistribution portion 1240, a first die 1250, and a second encapsulation layer 1260.

As shown in FIG. 12, the second redistribution portion 1240 of the first package 1202, is coupled to the package interconnect 210 of the second package 204, through at least one solder interconnect 270. The at least one solder interconnect 270 may be coupled to a redistribution layer and/or a UBM layer of the second redistribution portion 1240. The second redistribution portion 1240 is similar to the redistribution portion 240, in that the second redistribution portion 1240 includes at least one redistribution layer, at least one dielectric layer and/or a UBM layer.

FIG. 13 illustrates another package on package (PoP) device 1300. The package on package (PoP) device 1300 is similar to the package on package (PoP) device 200 of FIG. 2, except that the package on package (PoP) device 1300 includes more dies. The package on package (PoP) device 1300 includes a first package 1302 and a second package 1304.

As shown in FIG. 13, the first package 1302 includes the first package substrate 220, the first die 230, a third die 1330, the wire bond 290 (e.g., at least one wire bond), and the second wire bond 1390. The first die 230 is coupled to the wire bond 290. The third die 1330 is coupled to the second wire bond 1390. The third die 1330 is coupled (e.g., mounted) on the first die 230 (e.g., through an adhesive). However, in some implementations, the third die 1330 may be co-planar to the first die 230. That is, the third die 1330 may be coupled (e.g., mounted) on the first package substrate 220. The wire bond 290 and the second wire bond 1390 are coupled to the first package substrate 220 in a similar manner. The second wire bond 1390 may be coupled to interconnects (e.g., vias, pads, traces) in the first package substrate 220, which is coupled to a solder interconnect (e.g., solder interconnect 270).

The second package 1304 includes the redistribution portion 240, the second die 250, the package interconnect 210, a fourth die 1350, the encapsulation layer 260, and the solder ball 280. The second die 250 and the fourth die 1350 are coupled to the redistribution portion 240. The second die 250 and the fourth die 1350 may be co-planar to each other. The redistribution portion 240 may be a fan out portion. The encapsulation layer 260 at least partially encapsulates or surrounds the second die 250 and the fourth die 1350.

In some implementations, the package on package (PoP) device 1300 may also include electronic components. Examples of electronic components include a radio frequency (RF) filter, a power amplifier and a passive device (e.g., capacitor, inductor). These electronic components may be located in the first package 1302 and/or the second package 1304. These electronic components may be electrically coupled in the package on package (PoP) device 1300 in a similar manner as the dies. For example these electronic components may be electrically coupled through wire bond. These electronic components may be encapsulated by the encapsulation layer 260. For example, any of the dies described in the package on package (PoP) device 1300 may be replaced by an electronic component. In a similar manner, it is noted that any of the package on package (PoP) devices described in the present disclosure may include at least one electronic component (e.g., radio frequency (RF) filter, power amplifier, passive device).

FIG. 13 illustrates one example of a package on package (PoP) device that includes more than two dies. It is noted that any of the package on package (PoP) devices described in the present disclosure may be modified to include more than two dies. For example, the package on package (PoP) devices 1100, and/or 1200 may be modified in a similar manner to include more than two dies and/or include at least one electronic component (e.g., radio frequency (RF) filter, power amplifier, passive device).

Exemplary Electronic Devices

Figure 14:
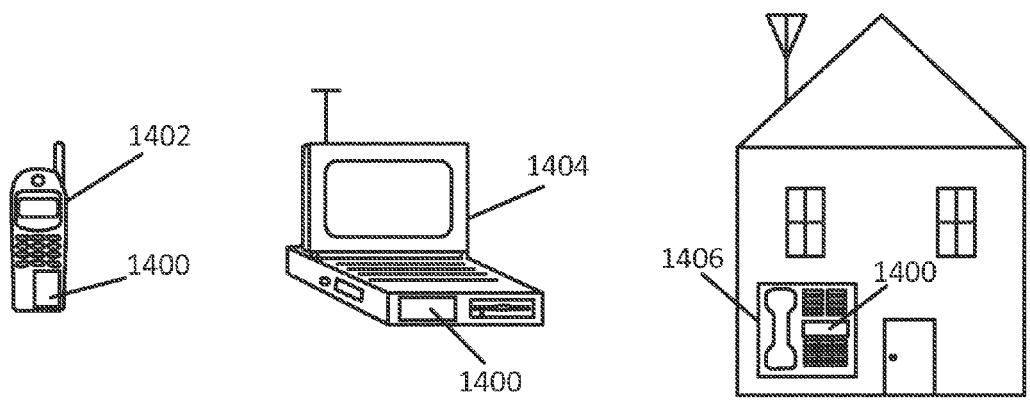
FIG. 14 illustrates various electronic devices that may include the various integrated devices, integrated device packages, semiconductor devices, dies, integrated circuits, packages and/or package on package (PoP) devices described herein.

FIG. 14 illustrates various electronic devices that may be integrated with any of the aforementioned integrated device, semiconductor device, integrated circuit, die, interposer, package or package-on-package (PoP). For example, a mobile phone device 1402, a laptop computer device 1404, and a fixed location terminal device 1406 may include an integrated device 1400 as described herein. The integrated device 1400 may be, for example, any of the integrated circuits, dies, integrated devices, integrated device packages, integrated circuit devices, package-on-package devices described herein. The devices 1402, 1404, 1406 illustrated in FIG. 14 are merely exemplary. Other electronic devices may also feature the integrated device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, features, and/or functions illustrated in FIGS. 2, 3, 4, 5, 6, 7, 8A-8C, 9A-9C, 10, 11, 12, and/or 13, 14 may be rearranged and/or combined into a single component, feature or function or embodied in several components, or functions. Additional elements, components, and/or functions may also be added without departing from the disclosure. It should also be noted that FIGS. 2, 3, 4, 5, 6, 7, 8A-8C, 9A-9C, 10, 11, 12, 13 and/or 14 and its corresponding description in the present disclosure is not limited to dies and/or ICs. In some implementations, FIGS. 2, 3, 4, 5, 6, 7, 8A-8C, 9A-9C, 10, 11, 12, 13 and/or 14 and its corresponding description may be used to manufacture, create, provide, and/or produce integrated devices. In some implementations, a device may include a die, an integrated device, a die package, an integrated circuit (IC), an integrated device package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the various disclosures may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package on package (PoP) device comprising: a first package; a first solder interconnect coupled to the first package; and a second package coupled to the first package through the first solder interconnect, wherein the second package comprises: a first die; a package interconnect comprising a first pad, wherein the first pad has a first surface that is coupled to the first solder interconnect, and the first surface has a surface roughness $R_a$ value that is about 1 micron (μm) or less, and wherein the surface roughness $R_a$ value is greater than zero; a redistribution portion coupled to the first die and the package interconnect; and an encapsulation layer at least partially encapsulating the first die and the package interconnect.

2. The package on package (PoP) device of claim 1, wherein the encapsulation layer at least partially encapsulates the package interconnect such that the encapsulation layer encapsulates at least a portion of the first solder interconnect.

3. The package on package (PoP) device of claim 1, wherein the encapsulation layer at least partially encapsulates the package interconnect such that there is a cavity between the encapsulation layer and a portion of the first pad when the first solder interconnect is coupled to the first pad and the first package.

4. The package on package (PoP) device of claim 1, wherein the first solder interconnect comprises:
   a first portion comprising a first property;
   a second portion comprising a second property; and
   a third portion comprising a third property.

5. The package on package (PoP) device of claim 4, wherein the second portion and the third portion of the first solder interconnect comprises an intermetallic material.

6. The package on package (PoP) device of claim 4, wherein the second portion is thicker than the third portion.

7. The package on package (PoP) device of claim 4, wherein the second portion is coupled to the first pad.

8. The package on package (PoP) device of claim 1, wherein the package interconnect further comprises:
   a first dielectric layer; and
   a first via in the first dielectric layer, wherein the first via is coupled to the first pad.

9. The package on package (PoP) device of claim 1, wherein the first die is configured to be electrically coupled to the package interconnect through the redistribution portion.

10. The package on package (PoP) device of claim 9, wherein the redistribution portion comprises:
    at least one dielectric layer; and
    at least one redistribution layer, wherein the first die is configured to be electrically coupled to the package interconnect through the at least one redistribution layer.

11. The package on package (PoP) device of claim 1, wherein the first package comprises:
    a package substrate; and
    a second die.

12. The package on package (PoP) device of claim 1, wherein the first package comprises a second die and a third die.

13. The package on package (PoP) device of claim 1, wherein the package interconnect further comprises a solder resist layer that covers part of the first pad, wherein the encapsulation layer at least partially encapsulates the package interconnect such that there is a cavity between the encapsulation layer and a portion of the solder resist layer when the first solder interconnect is coupled to the first pad and the first package.

14. The package on package (PoP) device of claim 1, wherein the package interconnect is a package interconnect from the group of package interconnects consisting of a printed circuit board (PCB) bar, a preformed through substrate via (TSV) bar, and/or an in-situ plated metal interconnect.

15. The package on package (PoP) device of claim 1, wherein the first package is a package from the group of packages consisting of a fan out wafer level package (FOWLP), a wire bond chip scale package (CSP), and/or a flip chip chip scale package (CSP).

16. The package on package (PoP) device of claim 1, wherein the package on package (PoP) device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in a automotive vehicle, and further including the device.

17. A package on package (PoP) device comprising: a first package; a first solder interconnect coupled to the first package; and a second package coupled to the first package through the first solder interconnect, wherein the second package comprises: a first die; means for interconnecting package portions coupled to the first solder interconnect, wherein the means for interconnecting package portions comprises a first pad, the first pad has a first surface that is coupled to the first solder interconnect, and the first surface has a surface roughness $R_a$ value that is about 1 micron (μm) or less, and wherein the surface roughness $R_a$ value is greater than zero; a redistribution portion coupled to the first die and the means for interconnecting package portions; and an encapsulation layer at least partially encapsulating the first die and the means for interconnecting package portions.

18. The package on package (PoP) device of claim 17, wherein the means for interconnecting package portions is a package interconnect from the group of package interconnects consisting of a printed circuit board (PCB) bar, a preformed through substrate via (TSV) bar, and/or an in-situ plated metal interconnect.

19. The package on package (PoP) device of claim 17, wherein the first package is a package from the group of packages consisting of a fan out wafer level package (FOWLP), a wire bond chip scale package (CSP), and/or a flip chip chip scale package (CSP).

20. The package on package (PoP) device of claim 1, wherein a surface of the package interconnect facing the first package is further away from the first package than a surface of the first die facing the first package.

\* \* \* \* \*